(12) United States Patent
Parham et al.

(10) Patent No.: US 9,118,022 B2
(45) Date of Patent: *Aug. 25, 2015

(54) ORGANIC ELECTROLUMINESCENT DEVICE

(75) Inventors: Amir Hossain Parham, Frankfurt am Main (DE); Arne Buesing, Frankfurt am Main (DE); Christof Pflumm, Darmstadt (DE); Teresa Mujica-Fernaud, Darmstadt (DE); Philipp Stoessel, Frankfurt am Main (DE); Thomas Eberle, Landau (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/122,272

(22) PCT Filed: May 7, 2012

(86) PCT No.: PCT/EP2012/001950
§ 371 (c)(1),
(2), (4) Date: Nov. 26, 2013

(87) PCT Pub. No.: WO2012/163465
PCT Pub. Date: Dec. 6, 2012

(65) Prior Publication Data
US 2014/0088305 A1  Mar. 27, 2014

(30) Foreign Application Priority Data
Jun. 3, 2011 (EP) .................................... 11004544

(51) Int. Cl.
*H01L 51/50* (2006.01)
*H01L 51/00* (2006.01)
*C09K 11/06* (2006.01)
*H05B 33/14* (2006.01)

(52) U.S. Cl.
CPC ............ *H01L 51/0072* (2013.01); *C09K 11/06* (2013.01); *H01L 51/0067* (2013.01); *H01L 51/5016* (2013.01); *H05B 33/14* (2013.01); *C09K 2211/1007* (2013.01); *C09K 2211/1011* (2013.01); *C09K 2211/1029* (2013.01); *C09K 2211/1044* (2013.01); *C09K 2211/1059* (2013.01); *C09K 2211/1092* (2013.01)

(58) Field of Classification Search
USPC ............................................ 514/285; 546/70
See application file for complete search history.

(56) References Cited

U.S. PATENT DOCUMENTS

2013/0082209 A1* 4/2013 Stoessel et al. .......... 252/301.16
2013/0168663 A1* 7/2013 Gerhard et al. .................. 257/40

FOREIGN PATENT DOCUMENTS

| EP | 2311826 A2 | | 4/2011 |
|---|---|---|---|
| JP | 06228544 | * | 8/1994 |
| WO | WO-2007011163 A1 | | 1/2007 |
| WO | WO 2010086089 | * | 8/2010 |
| WO | WO-2011019156 A1 | | 2/2011 |
| WO | WO 2011060867 | * | 5/2011 |
| WO | WO 2011157339 | * | 12/2011 |
| WO | WO 2011160757 | * | 12/2011 |
| WO | WO 2012007087 | * | 1/2012 |
| WO | WO 2012013271 | * | 2/2012 |

OTHER PUBLICATIONS

Umeda; Angew. Chem. Int. Ed., 2008, 47, 4019-4022.*
Loones;Tetrahedron, 2007, 63, 8954-8961.*
JP 06228544; EPO machine translation of description, Aug. 16, 1994.*
Tomoda, Haruhiko, et al., "Substituent Effects on Fluorescent Properties of Imidazol[1,2-α]Pyridiine-Based Compounds", Bull. Chem. Soc. Jpn., vol. 72, (1999), pp. 1327-1334.
International Search Report for PCT/EP2012/001950 mailed Jul. 31, 2012.

* cited by examiner

*Primary Examiner* — John Mabry
*Assistant Examiner* — Daniel Carcanague
(74) *Attorney, Agent, or Firm* — Drinker Biddle & Reath LLP

(57) ABSTRACT

The present invention relates to organic electroluminescent devices which comprise heteroaromatic compounds.

11 Claims, No Drawings

ORGANIC ELECTROLUMINESCENT DEVICE

RELATED APPLICATIONS

This application is a national stage application (under 35 U.S.C. §371) of PCT/EP2012/001950, filed May 7, 2012, which claims benefit of European Application No. 11004544.0, filed Jun. 3, 2011, which is incorporated by reference herein.

The present invention relates to organic electroluminescent devices which comprise heteroaromatic compounds.

The structure of organic electroluminescent devices (OLEDs) in which organic semiconductors are employed as functional materials is described, for example, in U.S. Pat. Nos. 4,539,507, 5,151,629, EP 0676461 and WO 98/27136. The emitting materials employed here are frequently organometallic complexes which exhibit phosphorescence instead of fluorescence. For quantum-mechanical reasons, an up to four-fold energy and power efficiency is possible using organometallic compounds as phosphorescence emitters. In general, there is still a need for improvement, for example with respect to efficiency, operating voltage and lifetime, in the case of OLEDs, in particular also in the case of OLEDs which exhibit triplet emission (phosphorescence).

The properties of phosphorescent OLEDs are not determined only by the triplet emitters employed. In particular, the other materials used, such as matrix materials, hole-blocking materials, electron-transport materials, hole-transport materials and electron- or exciton-blocking materials, are also of particular importance here. Improvements in these materials may thus also result in significant improvements in the OLED properties. There is still also a need for improvement in the case of these materials for fluorescent OLEDs.

In accordance with the prior art, ketones (for example in accordance with WO 2004/093207 or WO 2010/006680), phosphine oxides (for example in accordance with WO 2005/003253) or triazine derivatives (for example in accordance with WO 2010/015306), inter alia, are used as matrix materials for phosphorescent emitters. However, there is still a need for improvement, in particular with respect to the efficiency, the lifetime and the operating voltage of the device, on use of these matrix materials, as in the case of other matrix materials.

The object of the present invention is the provision of compounds which are suitable for use in a fluorescent or phosphorescent OLED, in particular a phosphorescent OLED, for example as matrix material or as hole-transport/electron-blocking material or exciton-blocking material or as electron-transport or hole-blocking material. In particular, the object of the present invention is to provide novel matrix materials for phosphorescent compounds, and novel hole-transport materials and electron-transport materials.

Surprisingly, it has been found that certain compounds, described in greater detail below, achieve this object and result in improvements in the organic electroluminescent device, in particular with respect to the lifetime, the efficiency and the operating voltage. This also applies, in particular, to phosphorescent electroluminescent devices, especially on use of the compounds according to the invention as matrix material, but also for the use of the compounds as hole-transport material, hole-injection material, electron-transport material or hole-blocking material, depending on the precise substitution of the compound. The present invention therefore relates to organic electroluminescent devices which comprise compounds of this type.

WO 2010/086089 discloses metal complexes which contain imidazoisoquinoline derivatives as ligands. The use of imidazoisoquinoline derivatives of this type which are not coordinated to a metal in organic electroluminescent devices is not described.

WO 2010/062065 furthermore discloses benzimidazophenanthridine derivatives. However, there is still a need for improvement in the case of these compounds, in particular with respect to the triplet energy, in order to be able to employ these compounds as matrix material for triplet emitters, in particular also for green triplet emitters.

Surprisingly, it has been found that specifically the use of the compounds described below in organic electroluminescent devices results in good electronic properties.

The present invention therefore relates to an organic electroluminescent device comprising a compound of one of the following formula (1) or formula (2),

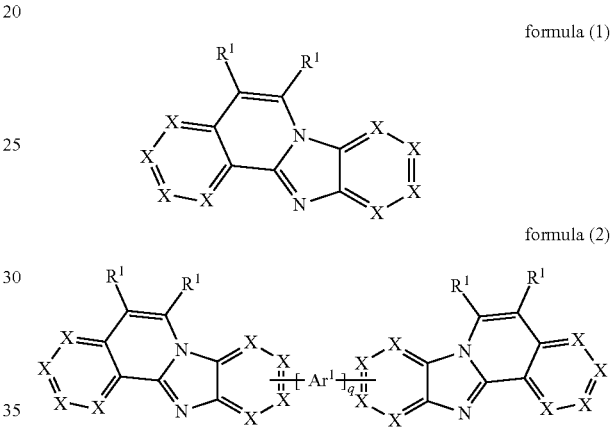

where the following applies to the symbols and indices used:
X is on each occurrence, identically or differently, CR or N, with the proviso that in each case a maximum of two groups X which are bonded directly to one another stand for N;
R, $R^1$ is selected on each occurrence, identically or differently, from the group consisting of H, D, F, Cl, Br, I, CN, $NO_2$, $N(Ar)_2$, $N(R^2)_2$, $C(=O)Ar$, $C(=O)R^2$, $P(=O)(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which may be substituted by one or more radicals $R^2$, where one or more non-adjacent $CH_2$ groups may be replaced by $R^2C=CR^2$, $C=C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms may be replaced by D, F, Cl, Br, I, CN or $NO_2$, an aromatic or heteroaromatic ring system having 5 to 80, preferably 5 to 60, aromatic ring atoms, which may in each case be substituted by one or more radicals $R^2$, an aryloxy or heteroaryloxy group having 5 to 60 aromatic ring atoms, which may be substituted by one or more radicals $R^2$, or an aralkyl or heteroaralkyl group having 5 to 60 aromatic ring atoms, which may be substituted by one or more radicals $R^2$; two or more adjacent substituents R here may form with one another a mono- or polycyclic, aliphatic, aromatic or heteroaromatic ring system, which may be substituted by one or more radicals $R^2$; the two substituents $R^1$ may furthermore form a mono- or polycyclic, aliphatic ring system with one another;

Ar$^1$ is, identically or differently on each occurrence, a divalent aryl or heteroaryl group having 5 to 18 C atoms, which may be substituted by one or more radicals R$^2$;

R$^2$ is selected on each occurrence, identically or differently, from the group consisting of H, D, F, Cl, Br, I, CN, NO$_2$, N(Ar)$_2$, N(R$^3$)$_2$, C(=O)Ar, C(=O)R$^3$, P(=O)(Ar)$_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which may be substituted by one or more radicals R$^3$, where one or more non-adjacent CH$_2$ groups may be replaced by R$^3$C=CR$^3$, C≡C, Si(R$^3$)$_2$, Ge(R$^3$)$_2$, Sn(R$^3$)$_2$, C=O, C=S, C=Se, C=NR$^3$, P(=O)(R$^3$), SO, SO$_2$, NR$^3$, O, S or CONR$^3$ and where one or more H atoms may be replaced by D, F, Cl, Br, I, CN or NO$_2$, an aromatic or heteroaromatic ring system having 5 to 60 aromatic ring atoms, which may in each case be substituted by one or more radicals R$^3$, an aryloxy or heteroaryloxy group having 5 to 60 aromatic ring atoms, which may be substituted by one or more radicals R$^3$, or an aralkyl or heteroaralkyl group having 5 to 60 aromatic ring atoms, where two or more adjacent substituents R$^2$ may optionally form a monocyclic or polycyclic, aliphatic, aromatic or heteroaromatic ring system, which may be substituted by one or more radicals R$^3$;

Ar is on each occurrence, identically or differently, an aromatic or heteroaromatic ring system having 5-30 aromatic ring atoms, which may be substituted by one or more non-aromatic radicals R$^3$; two radicals Ar here which are bonded to the same N atom or P atom may also be bridged to one another by a single bond or a bridge selected from N(R$^3$), C(R$^3$)$_2$, O or S;

R$^3$ is selected from the group consisting of H, D, F, CN, an aliphatic hydrocarbon radical having 1 to 20 C atoms, an aromatic or heteroaromatic ring system having 5 to 30 aromatic ring atoms, in which one or more H atoms may be replaced by D, F, Cl, Br, I or CN, where two or more adjacent substituents R$^3$ may form a mono- or polycyclic, aliphatic, aromatic or heteroaromatic ring system with one another;

q is on each occurrence, identically or differently, 0, 1, 2 or 3; an organic electroluminescent device comprising the following compound is excluded from the invention:

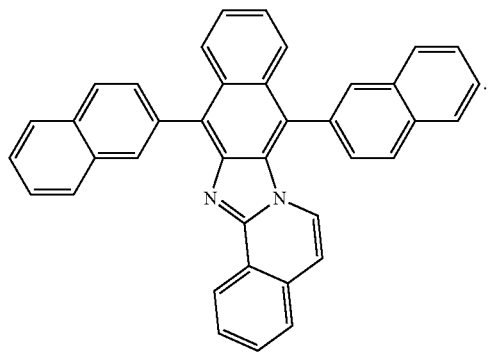 [SMILES: c1ccc2cc(-c3c4ccccc4c(-c4ccc5ccccc5c4)c4c3nc3c5ccccc5ccn34)ccc2c1]

In the definition of X, "with the proviso that in each case a maximum of two groups X which are bonded directly to one another stand for N" means that three or more N atoms cannot be bonded directly to one another in one of the rings of the compound of the formula (1).

The organic electroluminescent device according to the invention comprises anode, cathode and at least one emitting layer, which is arranged between the anode and the cathode, and may also comprise further layers. The organic electroluminescent device need not necessarily comprise only layers which are built up from organic or organometallic materials. Thus, it is also possible for anode, cathode and/or one or more layers to comprise inorganic materials or to be built up entirely from inorganic materials.

An aryl group in the sense of this invention contains 6 to 60 C atoms; a heteroaryl group in the sense of this invention contains 2 to 60 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed (fused) aryl or heteroaryl group, for example naphthalene, anthracene, phenanthrene, quinoline, isoquinoline, etc. Aromatic rings linked to one another by a single bond, such as, for example, biphenyl, are, by contrast, not referred to as an aryl or heteroaryl group, but instead as an aromatic ring system.

An aromatic ring system in the sense of this invention contains 6 to 80 C atoms in the ring system. A heteroaromatic ring system in the sense of this invention contains 2 to 60 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be connected by a non-aromatic unit (preferably less than 10% of the atoms other than H), such as, for example, a C, N or O atom. Thus, for example, systems such as fluorene, 9,9'-spirobifluorene, 9,9-diarylfluorene, triarylamine, diaryl ether, stilbene, etc., are also intended to be taken to be aromatic ring systems in the sense of this invention, as are systems in which two or more aryl groups are connected, for example, by a short alkyl group. Furthermore, aromatic rings linked to one another by a single bond, such as, for example, biphenyl, are referred to as an aromatic ring system in the sense of this application.

For the purposes of the present invention, an aliphatic hydrocarbon radical or an alkyl group or an alkenyl or alkynyl group, which may typically contain 1 to 40 or also 1 to 20 C atoms and in which, in addition, individual H atoms or CH$_2$ groups may be substituted by the above-mentioned groups, is preferably taken to mean the radicals methyl, ethyl, n-propyl, i-propyl, n-butyl, i-butyl, s-butyl, t-butyl, 2-methylbutyl, n-pentyl, s-pentyl, cyclo-pentyl, n-hexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, heptynyl or octynyl. An alkoxy group having 1 to 40 C atoms is preferably taken to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy and 2,2,2-trifluoroethoxy. A thioalkyl group having 1 to 40 C atoms is taken to mean, in particular, methylthio, ethylthio, n-propylthio, i-propylthio, n-butylthio, i-butylthio, s-butylthio, t-butylthio, n-pentylthio, s-pentylthio, n-hexylthio, cyclo-hexylthio, n-heptylthio, cycloheptylthio, n-octylthio, cyclooctylthio, 2-ethyl-hexylthio, trifluoromethylthio, pentafluoroethylthio, 2,2,2-trifluoroethylthio, ethenylthio, propenylthio, butenylthio, pentynylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio. In general, alkyl, alkenyl, alkynyl, alkoxy or thioalkyl groups in accordance with the present invention may be straight-chain, branched or cyclic, where one or more non-adjacent $CH_2$ groups may be replaced by the above-mentioned groups; furthermore, one or more H atoms may also be replaced by D, F, Cl, Br, I, CN or $NO_2$, preferably F, Cl or CN, further preferably F or CN, particularly preferably CN.

An aromatic or heteroaromatic ring system having 5-80 aromatic ring atoms, which may also in each case be substituted by the above-mentioned radicals $R^2$ or a hydrocarbon radical and which may be linked via any desired positions on the aromatic or heteroaromatic group, is taken to mean, in particular, groups derived from benzene, naphthalene, anthracene, benzanthracene, phenanthrene, benzophenanthrene, pyrene, chrysene, perylene, fluoranthene, naphthacene, pentacene, benzopyrene, biphenyl, biphenylene, terphenyl, triphenylene, fluorene, spirobifluorene, dihydrophenanthrene, dihydropyrene, tetrahydropyrene, cis- or trans-indenofluorene, cis- or trans-indenocarbazole, cis- or trans-indolocarbazole, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, hexaazatriphenylene, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole or groups derived from combination of these systems.

As stated above, adjacent radicals R may also form an aliphatic or aromatic ring system with one another. Furthermore, the radicals $R^1$ may form an aliphatic ring system with one another. Adjacent radicals in the sense of the present invention are taken to mean radicals which are bonded to atoms which are bonded directly to one another. The radicals here are as defined above, and two radicals are in each case bonded to one another with formal elimination of a hydrogen atom. If the radicals R or $R^1$ are alkyl groups, the formation of a condensed-on cycloalkyl group, for example, is thus possible. If the radicals R are vinyl groups or one vinyl group and one hydrogen atom, the formation of a condensed aryl group, for example, is possible. If the radicals R or $R^1$ form a ring system, it is preferably a five-membered ring or a six-membered ring.

In a preferred embodiment of the invention, adjacent radicals R do not form a ring with one another or form an aliphatic ring with one another. In a particularly preferred embodiment of the invention, adjacent radicals R do not form a ring with one another, and the radicals $R^1$ do not form a ring with one another.

In a preferred embodiment of the formula (1) or formula (2), a maximum of one group X in each ring stands for N, and the other groups X stand, identically or differently on each occurrence, for CR. In a particularly preferred embodiment of the formula (1) or formula (2), in total a maximum of one group X in each benzimidazoisoquinoline unit or in each unit derived therefrom stands for N, and the other groups X stand, identically or differently on each occurrence, for CR. In a very particularly preferred embodiment of the formula (1) or formula (2), all groups X stand, identically or differently on each occurrence, for CR.

Particularly preferred embodiments of the formula (1) are therefore the structures of the following formulae (3) to (11),

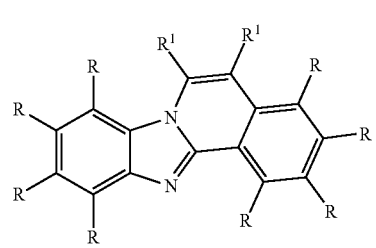

formula (3)

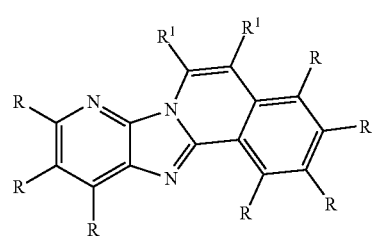

formula (4)

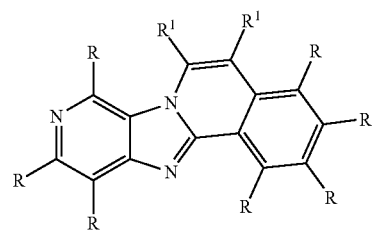

formula (5)

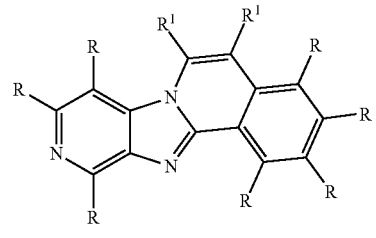

formula (6)

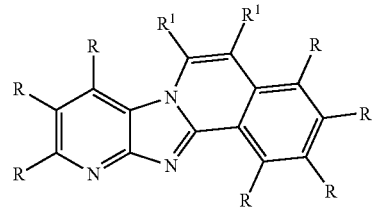

formula (7)

formula (8)
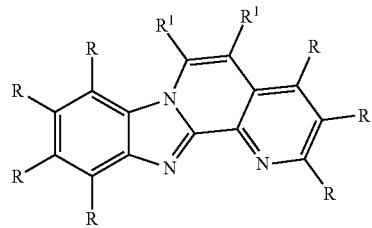

formula (9)
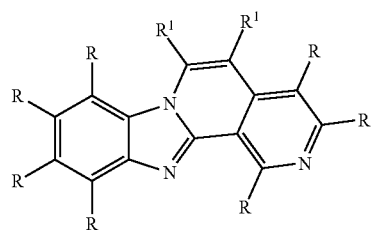

formula (10)
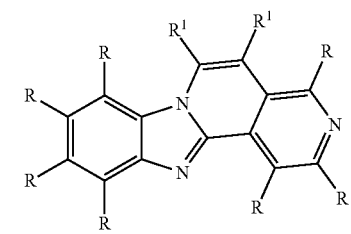

formula (11)
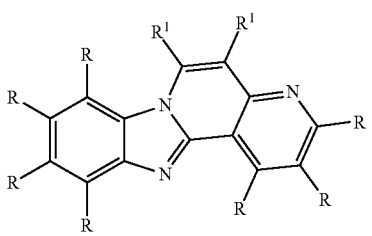

where the symbols used have the meanings given above.

Of these structures, particular preference is given to the structures of the formulae (3), (4) and (7).

Preferred embodiments of the formula (2) are structures of the following formula (12), formula (12)
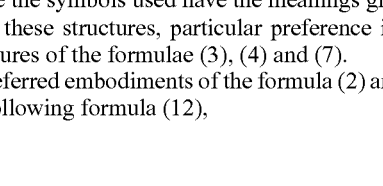

where the symbols and indices used have the meanings given above.

In a further preferred embodiment of the compounds of the formula (1) or formula (2), at least one group R and/or $R^1$ is not equal to H or D. Particularly preferably, precisely in total one or two groups R or $R^1$ are not equal to H or D.

Particularly preferred embodiments of the compounds of the formula (3) here are the compounds of the following formulae (3a) to (3i), formula (3a)
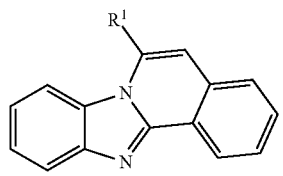

formula (3b)
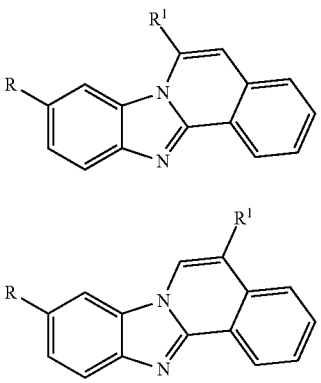

formula (3c)

formula (3d)

formula (3e)

formula (3f)
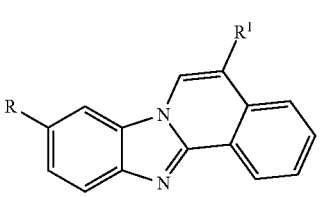

formula (3g)
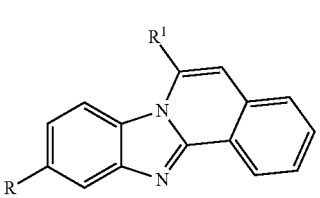

formula (3h)
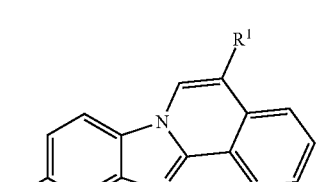

-continued

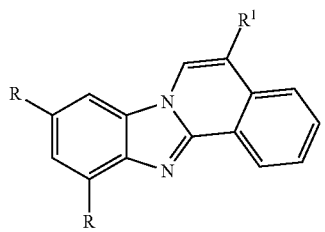

formula (3i)

where the symbols used have the meanings given above and R and $R^1$ are not equal to H or D. Preferred structures here are the compounds of the formulae (3c), (3f) and (3i).

Various groups are possible as substituents R or $R^1$, depending on the use of the compounds. In a preferred embodiment of the invention, R or $R^1$ is selected on each occurrence, identically or differently, from the group consisting of H, D, F, CN, $N(Ar)_2$, C(=O)Ar, P(=O)$(Ar)_2$, a straight-chain alkyl group having 1 to 10 C atoms or a branched or cyclic alkyl group having 3 to 10 C atoms or an alkenyl group having 2 to 10 C atoms, each of which may be substituted by one or more radicals $R^2$, where one or more non-adjacent $CH_2$ groups may be replaced by O or S and where one or more H atoms may be replaced by D or F, an aromatic or heteroaromatic ring system having 6 to 30 aromatic ring atoms, which may in each case be substituted by one or more radicals $R^2$.

In a particularly preferred embodiment of the invention, R or $R^2$ is selected on each occurrence, identically or differently, from the group consisting of H, D, $N(Ar)_2$ or an aromatic or heteroaromatic ring system having 6 to 18 aromatic ring atoms, which may in each case be substituted by one or more radicals $R^2$.

For compounds which are processed by vacuum evaporation, the alkyl groups in the radicals R or $R^1$ or $R^2$ preferably have not more than four C atoms, particularly preferably not more than one C atom. For compounds which are processed from solution, compounds which are substituted by alkyl groups having up to 10 C atoms or those which are substituted by oligoarylene groups, for example ortho-, meta-, para- or branched terphenyl groups or quaterphenyl groups or ortho-, meta- or para-biphenyl groups, are also suitable in particular.

Depending on the layer in which the compound of the formula (1) or formula (2) or the preferred embodiments are employed, the substituents R or $R^1$ are selected differently.

If the compound according to the invention is employed as matrix material for a phosphorescent emitter or as electron-transport material or as hole-blocking material, at least one substituent R and/or $R^1$ is preferably an electron-deficient group, in particular selected from structures of the following formulae (13) to (17),

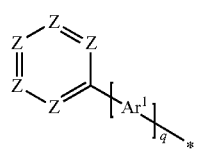

formula (13)

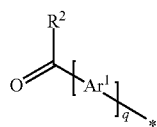

formula (14)

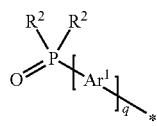

formula (15)

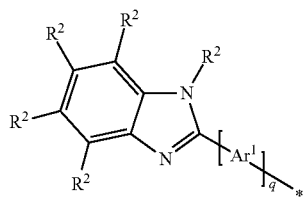

formula (16)

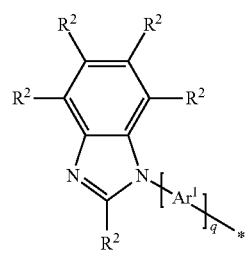

formula (17)

where $R^2$, $Ar^1$ and q have the meanings given above, * indicates the position of the bond to the basic structure of the formula (1) or formula (2) and furthermore:

Z is on each occurrence, identically or differently, $CR^2$ or N, with the proviso that one group Z, two groups Z or three groups Z stand for N.

In a particularly preferred embodiment of the invention, at least one substituent R or $R^1$ stands for a group of the above-mentioned formula (13), where in each case two or three symbols Z stand for N and the other symbols Z stand for $CR^2$. Particularly preferred groups R or $R^1$ are therefore the groups of the following formulae (18) to (24),

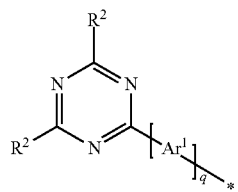

formula (18)

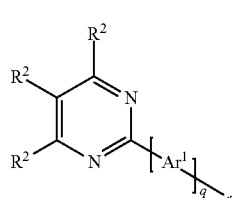

formula (19)

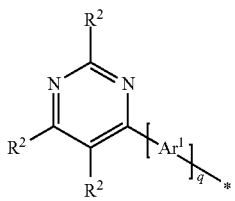
formula (20)

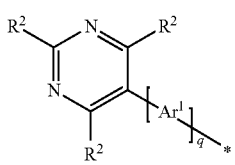
formula (21)

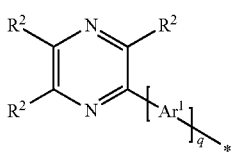
formula (22)

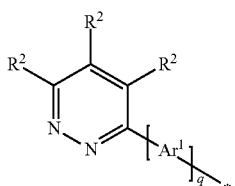
formula (23)

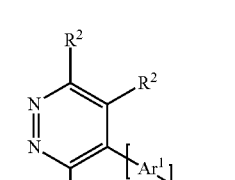
formula (24)

where the symbols and indices used have the meanings given above.

If R or $R^1$ stands for a group of the formula (18), $R^2$ in this group then preferably stands for an aromatic or heteroaromatic ring system having 5 to 24 aromatic ring atoms, which may be substituted by one or more radicals $R^3$, in particular for phenyl, ortho-, meta- or para-biphenyl, ortho-, meta-, para- or branched terphenyl or ortho-, meta-, para- or branched quaterphenyl.

If R stands for a group of the formula (19) to (24), $R^2$ in these groups then preferably stands, identically or differently on each occurrence, for H, D or an aromatic or heteroaromatic ring system having 5 to 24 aromatic ring atoms, which may be substituted by one or more radicals $R^3$, in particular for phenyl, ortho-, meta- or para-biphenyl, ortho-, meta-, para- or branched terphenyl or ortho-, meta-, para- or branched quaterphenyl.

If the compound according to the invention is employed as matrix material for a phosphorescent emitter or as hole-transport material or as electron-blocking material, at least one substituent R or $R^1$ is preferably selected from the group consisting of —NAr$_2$, triarylamine derivatives, carbazole derivatives, indenocarbazole derivatives, indolocarbazole derivatives, azacarbazole derivatives, indole derivatives, furan derivatives, benzofuran derivatives, dibenzofuran derivatives, thiophene derivatives, benzothiophene derivatives or dibenzothiophene derivatives, each of which may be substituted by one or more radicals $R^2$. These groups are preferably selected from the groups of the following formulae (25) to (42),

formula (25)

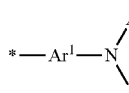
formula (26)

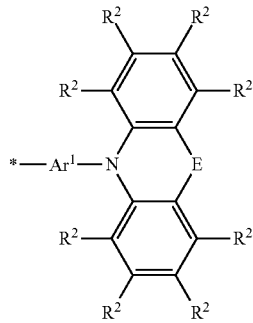
formula (27)

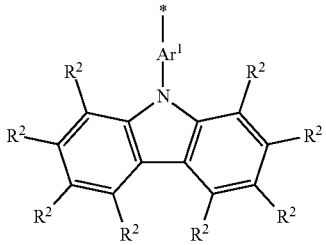
formula (28)

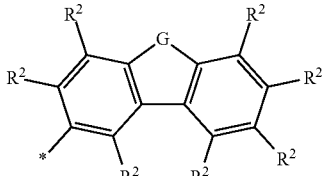
formula (29)

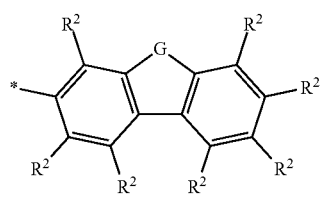
formula (30)

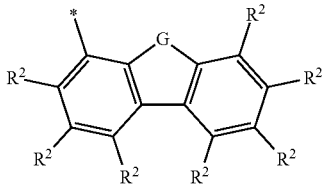
formula (31)

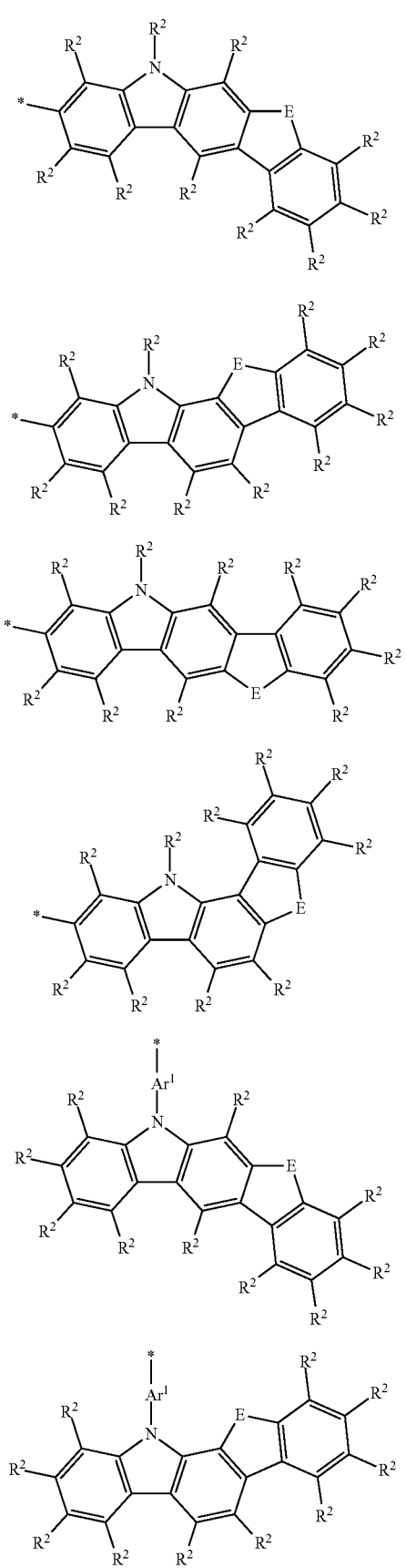
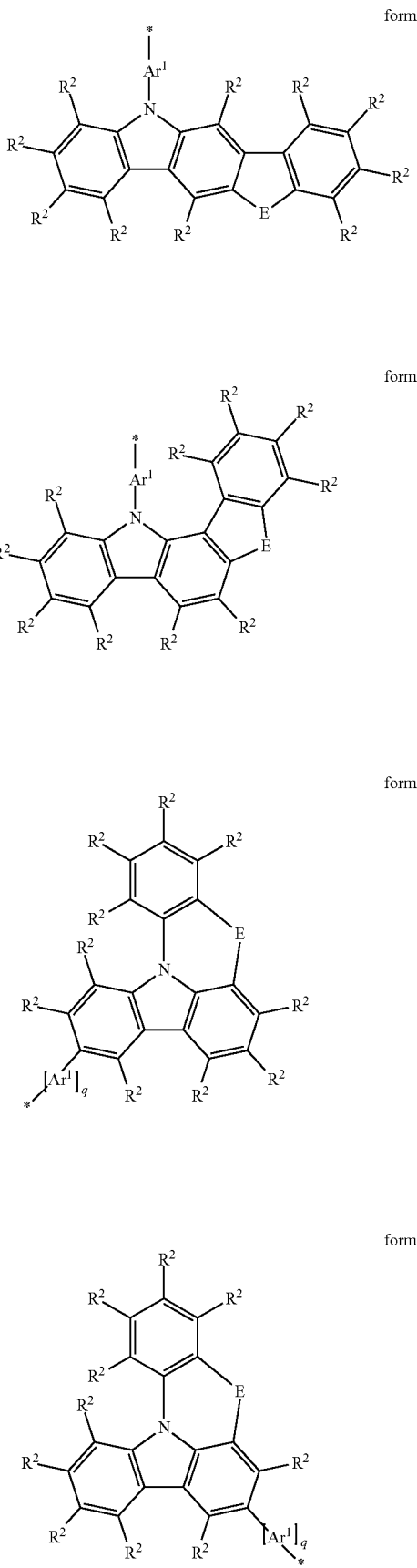

-continued

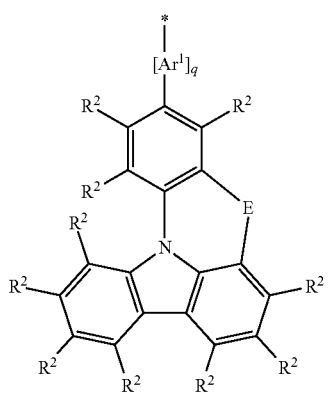

formula (42)

where the symbols used have the meanings given above and furthermore:

E is selected from the group consisting of $C(R^2)_2$, $NR^2$, O or S;

G is selected from the group consisting of $NR^2$, O or S.

Further preferred radicals R or $R^1$ are selected from the group of the aromatic ring systems comprising benzene, naphthalene, fluorene, spirobifluorene, anthracene, benzanthracene, phenanthrene, triphenylene or a combination of two, three or four of these groups, which may be identical or different; these groups may also be substituted by one or more radicals $R^2$. Particular preference is given to ortho-, meta- or para-biphenyl, ortho-, meta-, para- or branched terphenyl or branched quaterphenyl structures.

The above-mentioned embodiments of the invention can be combined with one another as desired. In particular, the general formulae (1) or (2) or (3) to (12) or (3a) to (3i) indicated above can be combined as desired with the above-mentioned preferred embodiments for X, R and $R^1$. In a preferred embodiment of the invention, the above-mentioned preferences occur simultaneously.

Examples of compounds as can preferably be employed in the organic electroluminescent devices according to the invention are the following compounds.

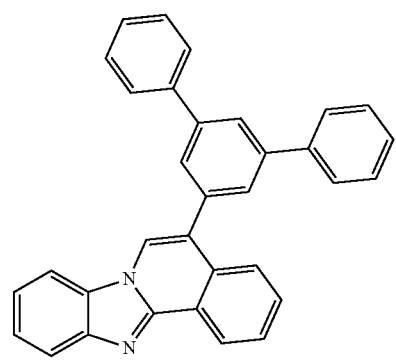

(1)

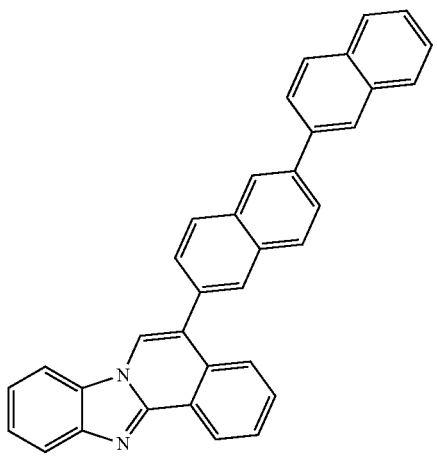

(2)

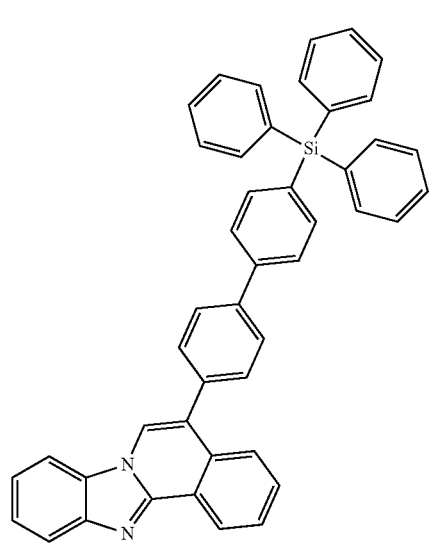

(3)

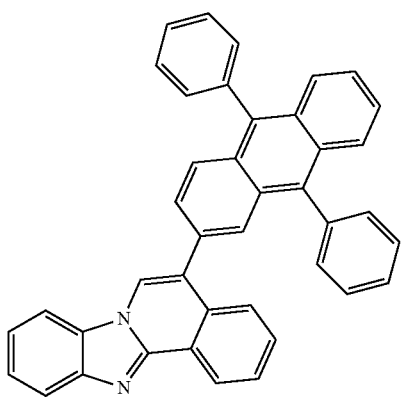

(4)

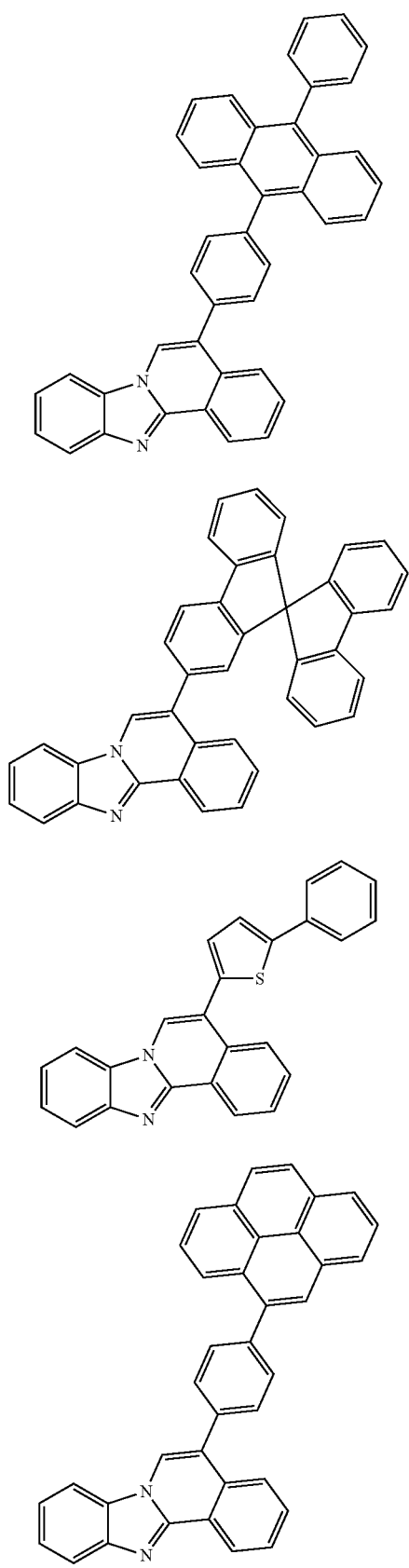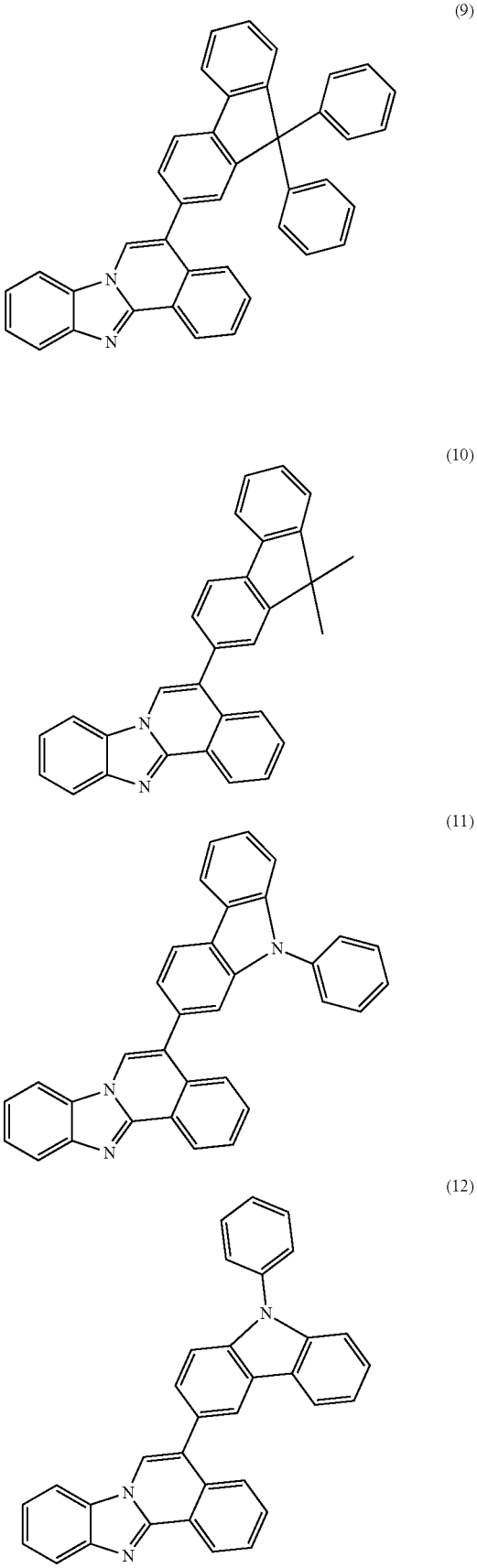

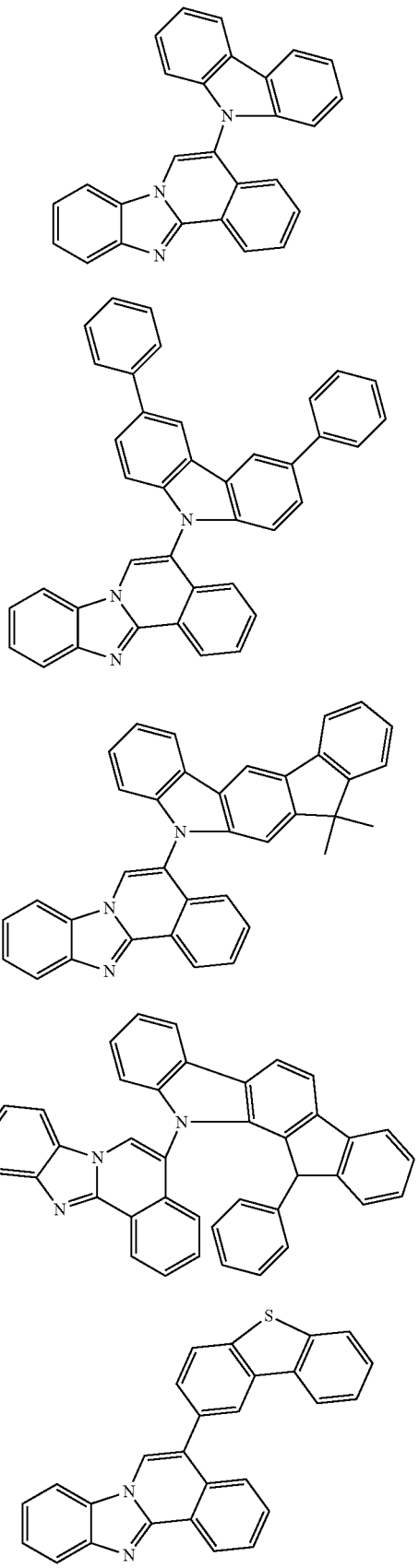
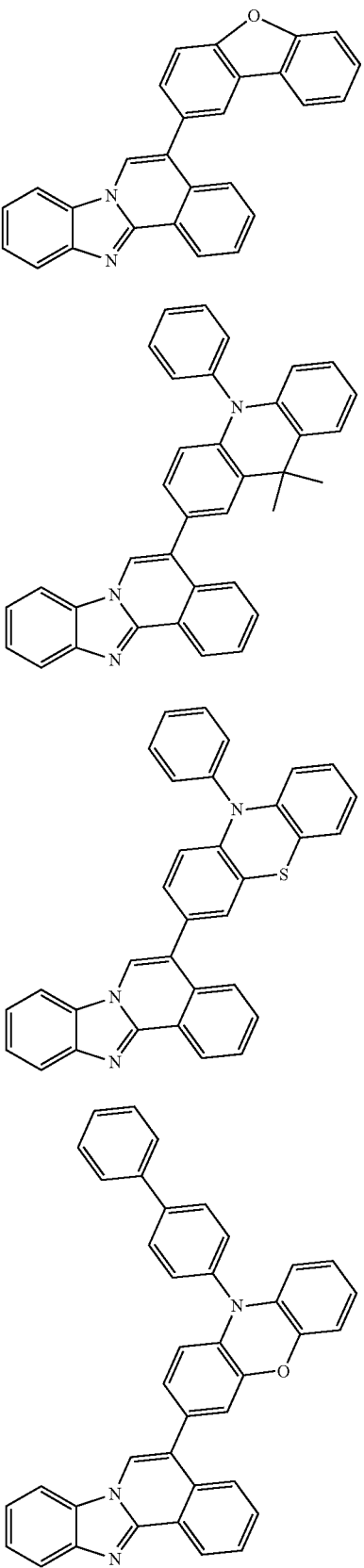

-continued
(22)
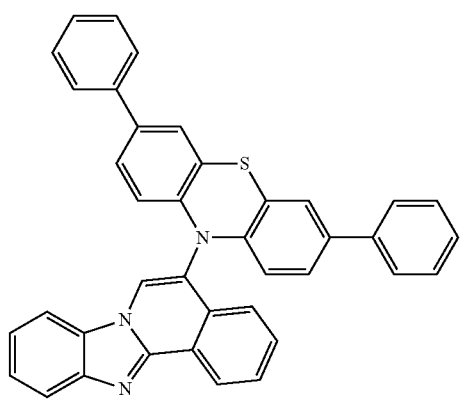
(23)
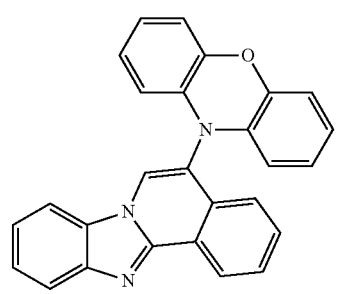
(24)
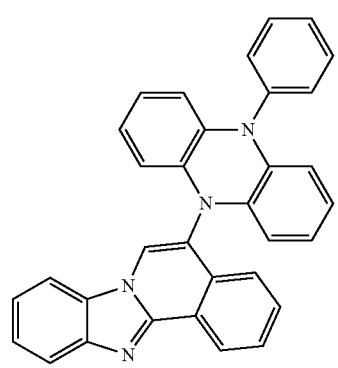
(25)
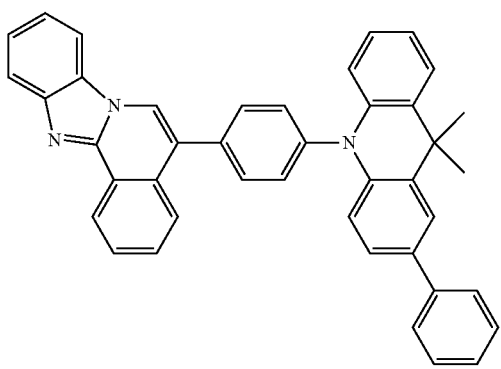
(26)
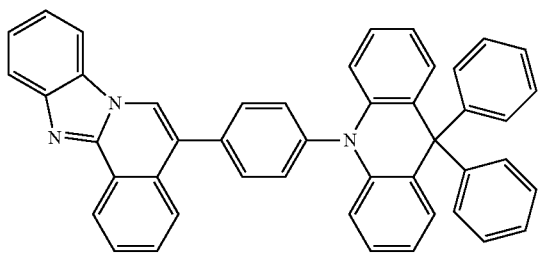
(27)
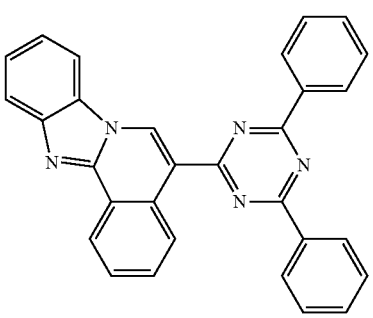
(28)
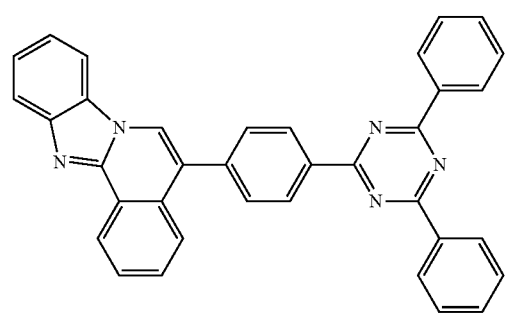
(29)
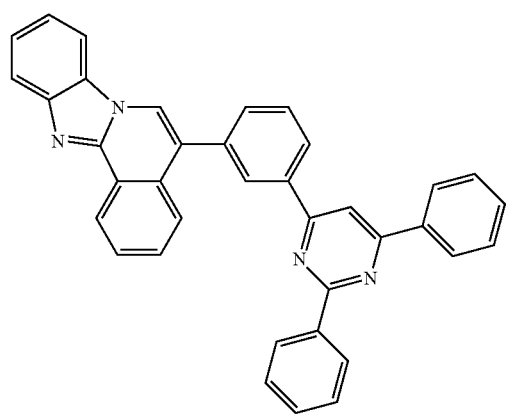

(30)
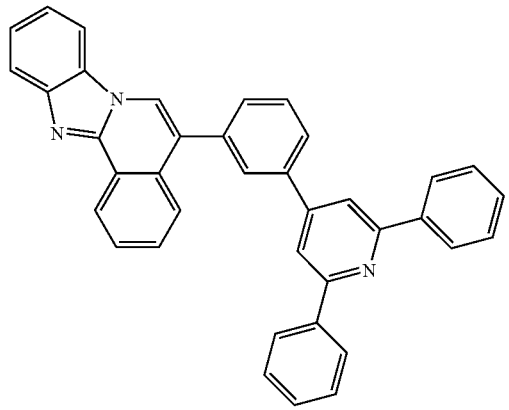
(33)
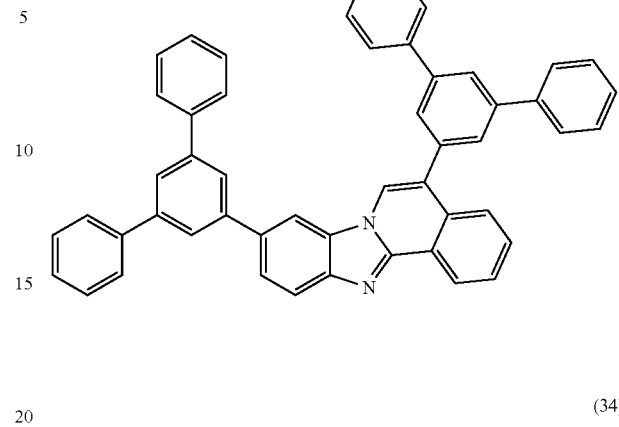
(31)
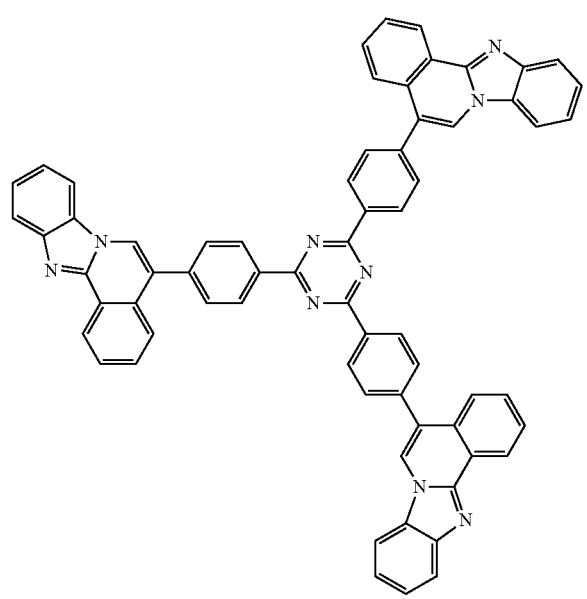
(34)
(35)
(32)
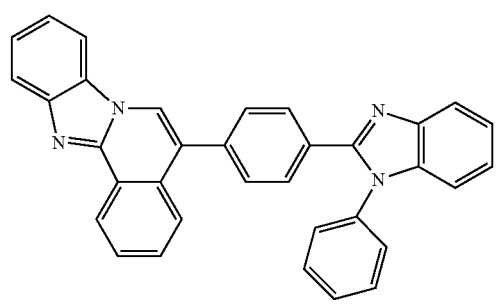
(36)
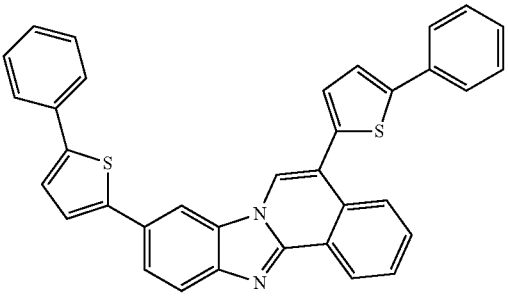

-continued
(37)
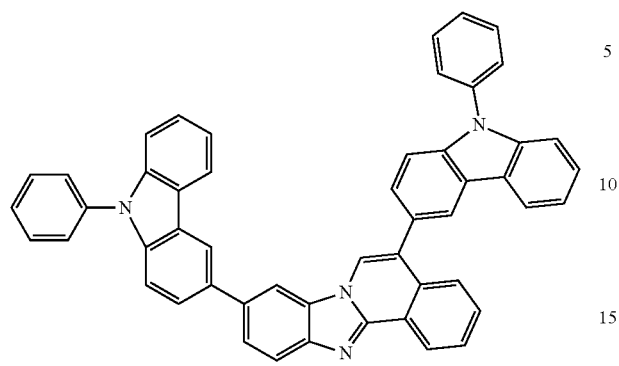
(38)
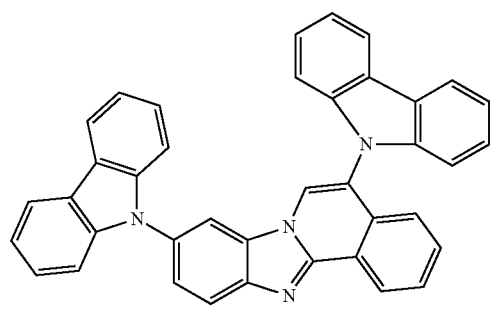
(39)
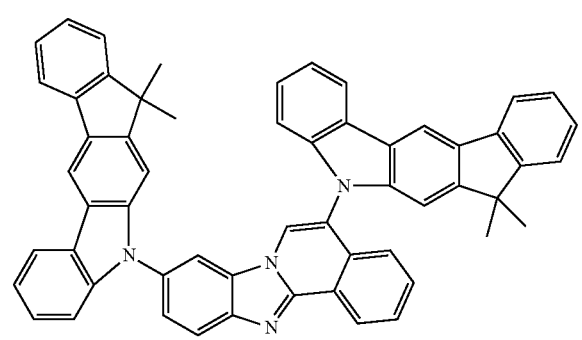
(40)
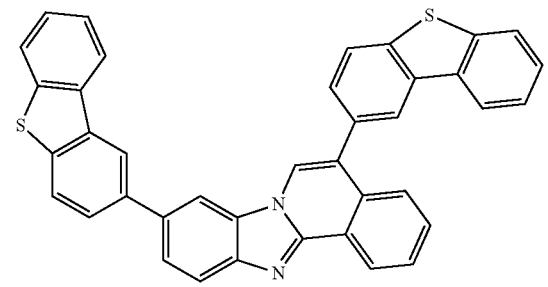
-continued
(41)
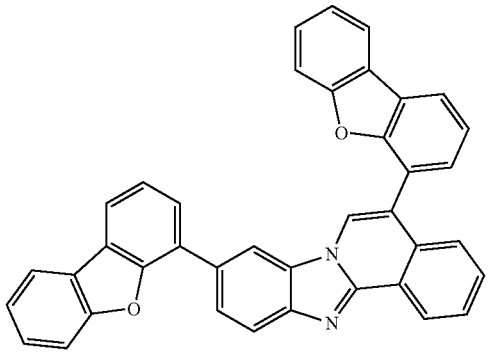
(42)
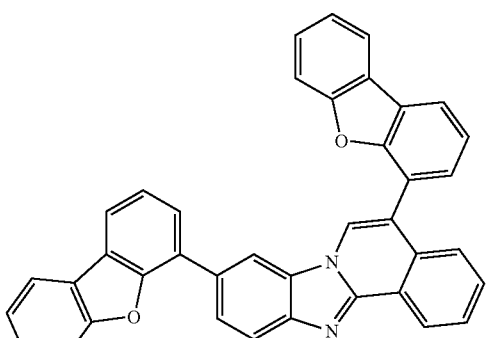
(43)
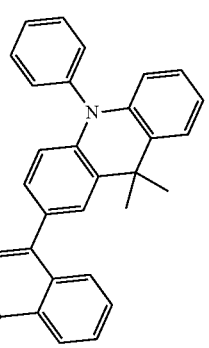
(44)
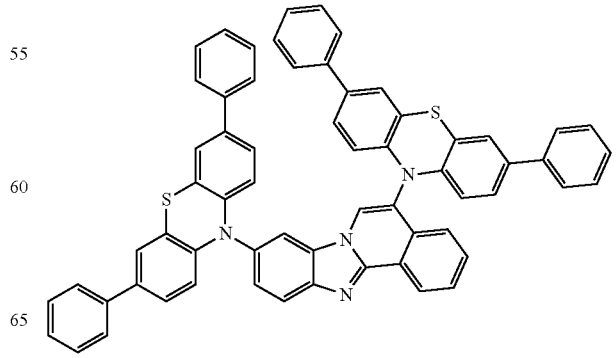

(45)
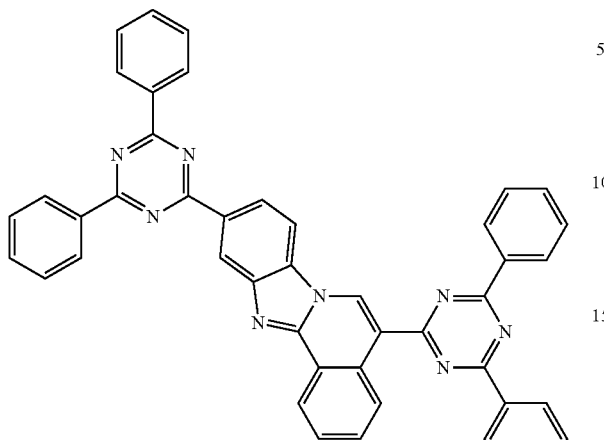
(46)
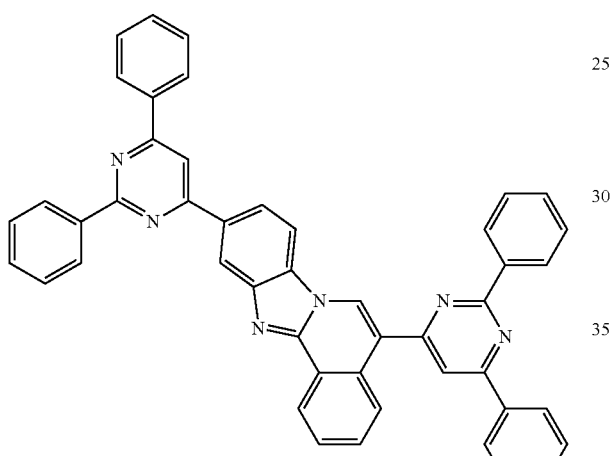
(47)
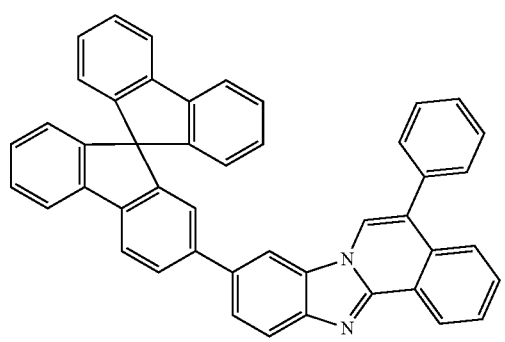
(48)
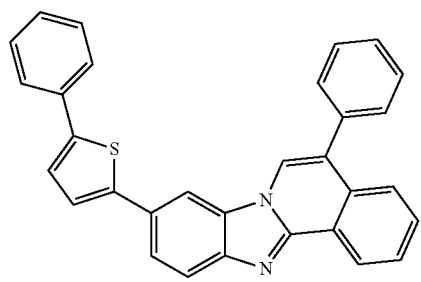
(49)
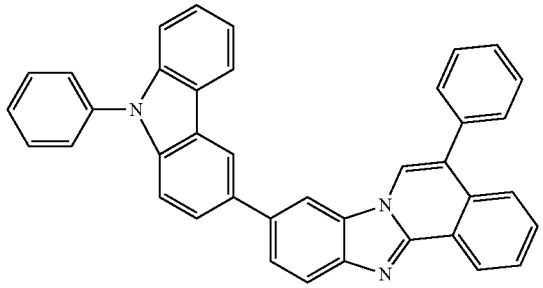
(50)
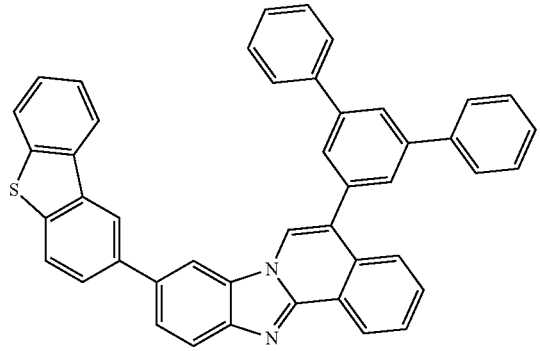
(51)
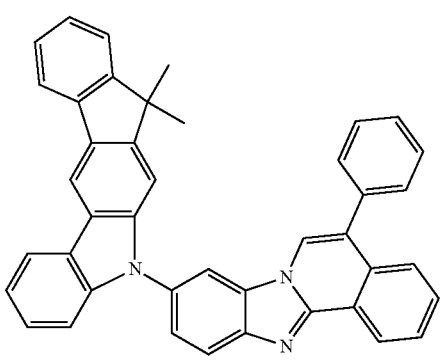
(52)
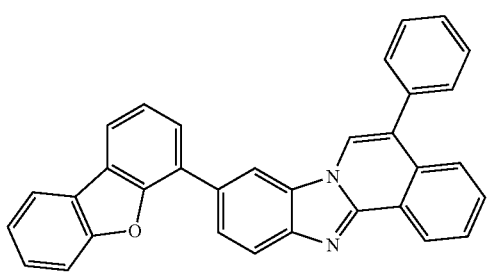

(53)
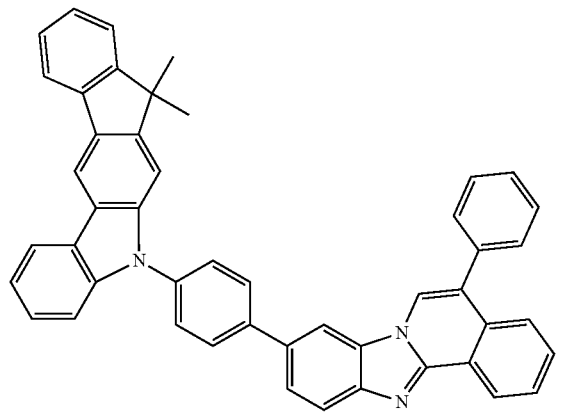
(54)
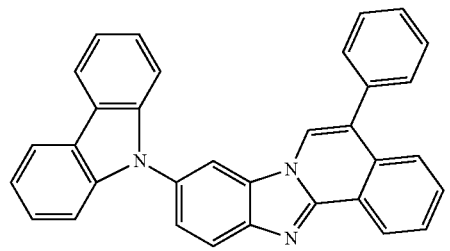
(55)
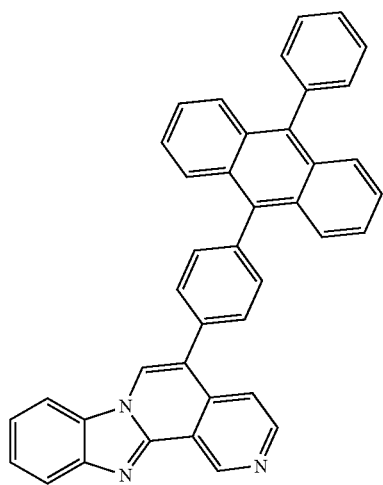
(56)
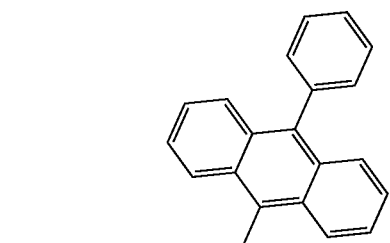
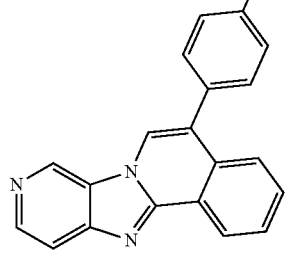
(57)
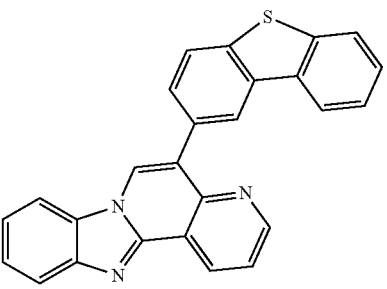
(58)
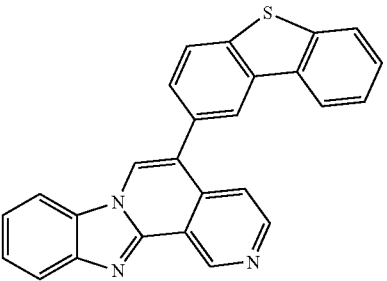
(59)
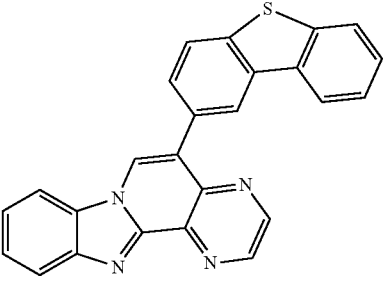
(60)
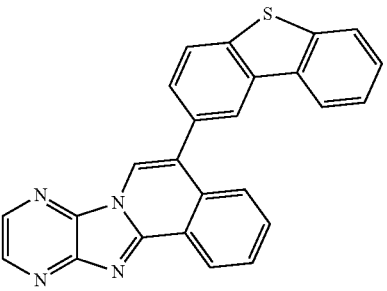
(61)
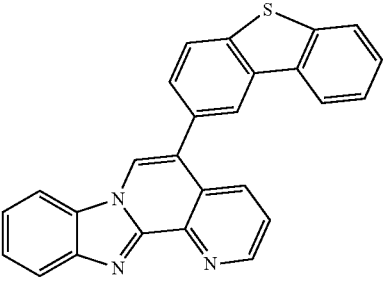

(62)
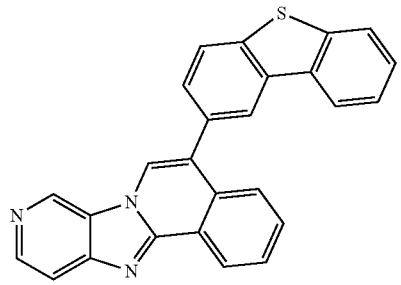
(63)
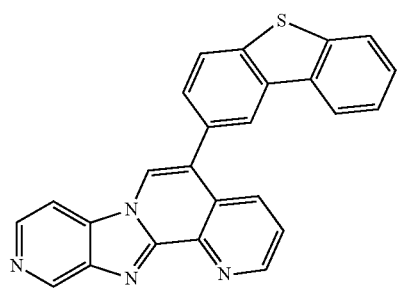
(64)
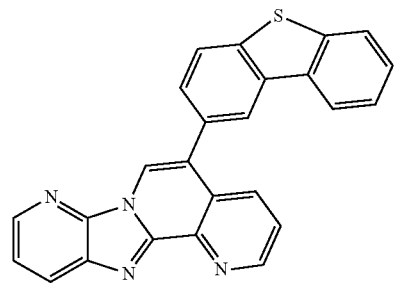
(65)
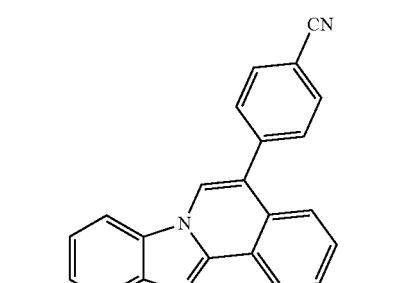
(66)
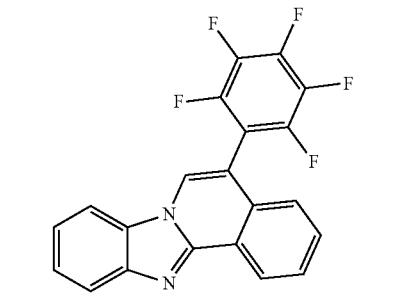
(67)
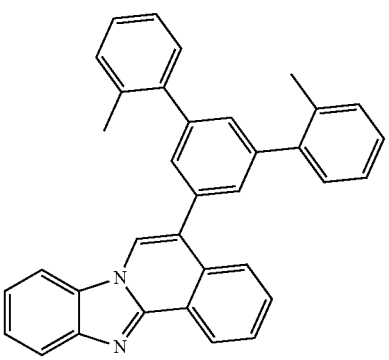
(68)
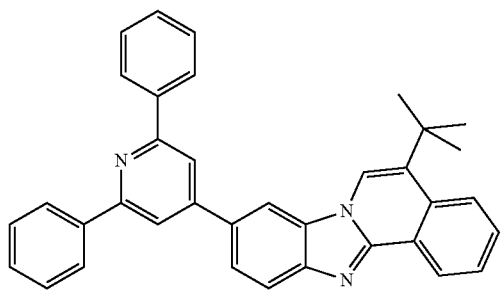
(69)
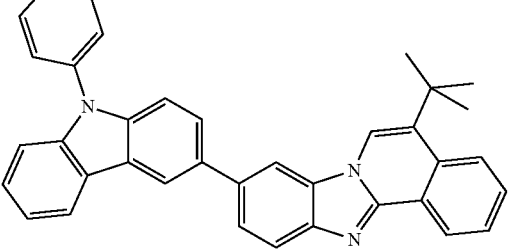
(70)
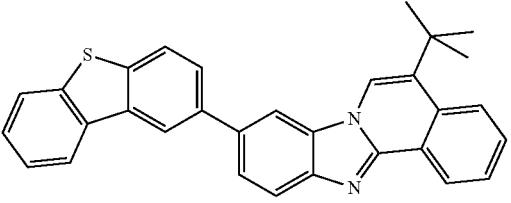
(71)
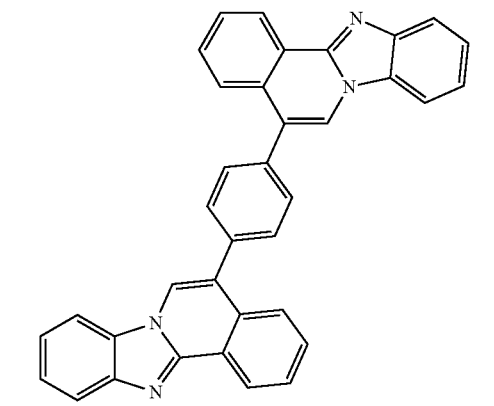

-continued
(72)
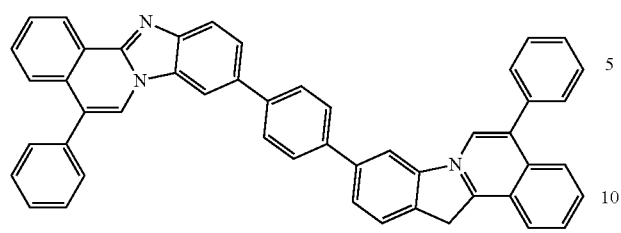
(73)
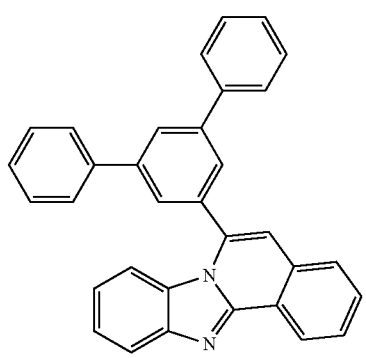
(74)
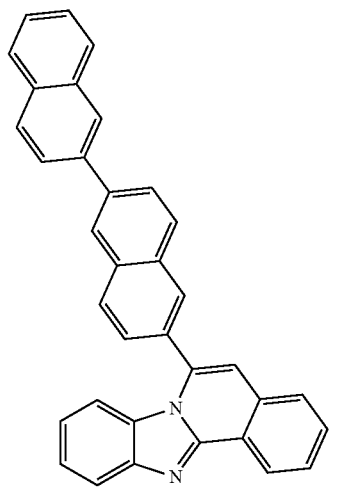
(75)
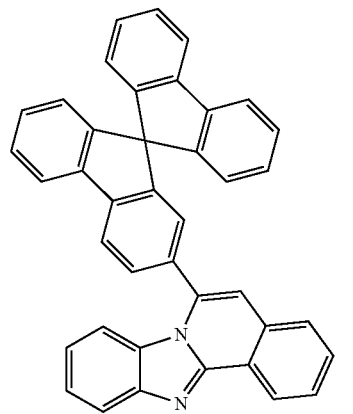
-continued
(76)
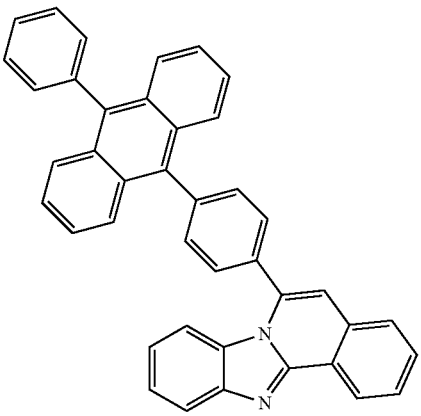
(77)
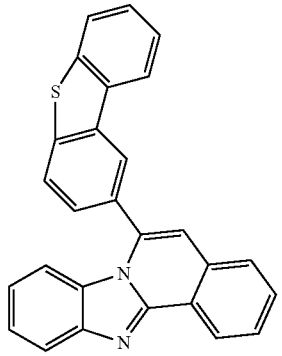
(78)
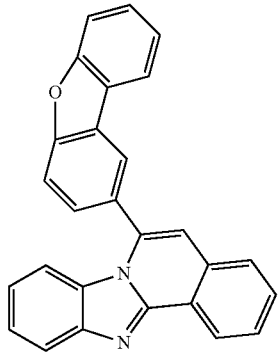
(79)
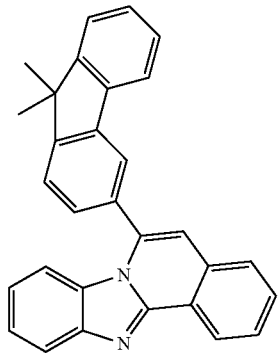

-continued
(80)
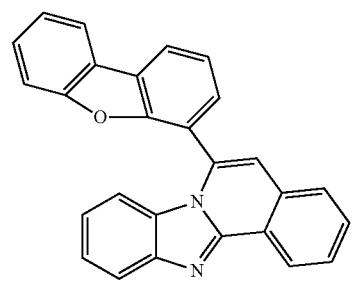
(81)
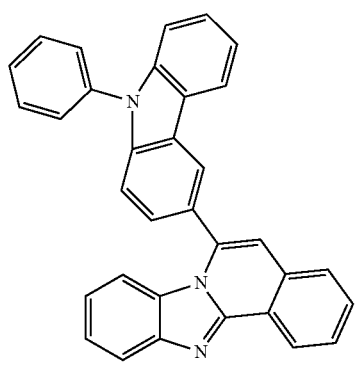
(82)
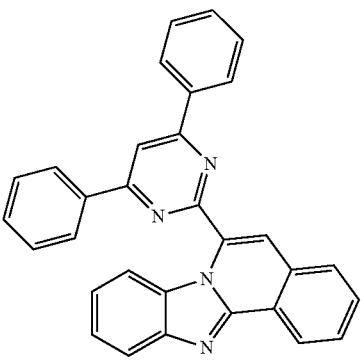
(83)
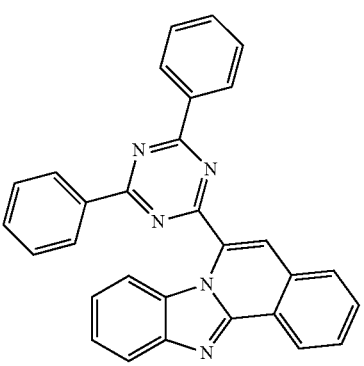
-continued
(84)
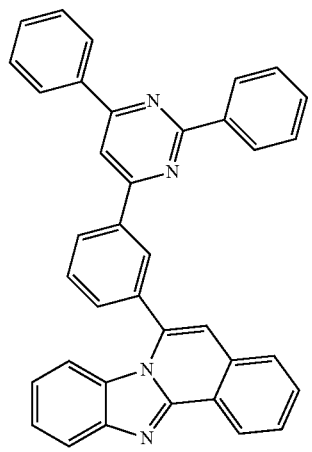
(85)
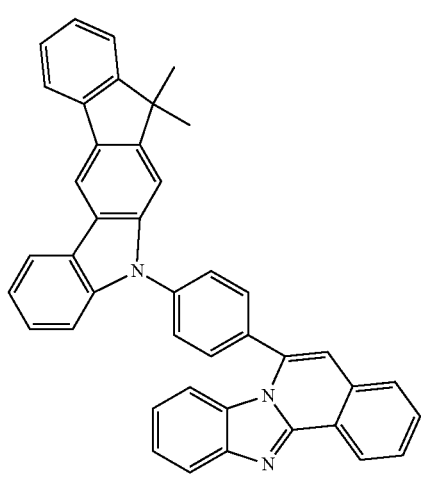
(86)
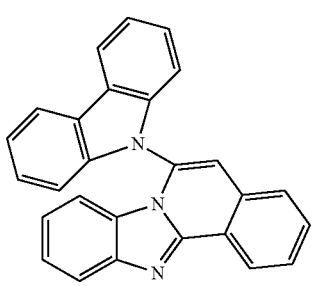
(87)
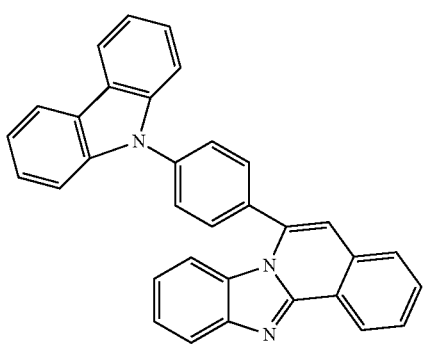

(88)
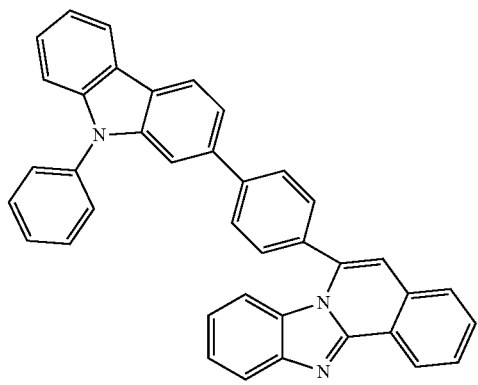
(92)
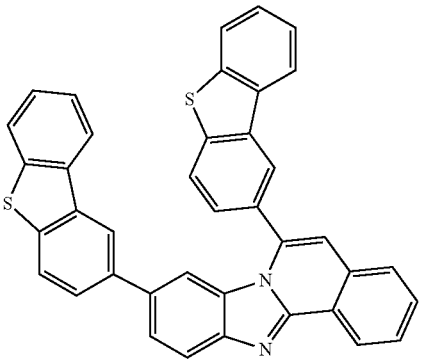
(89)
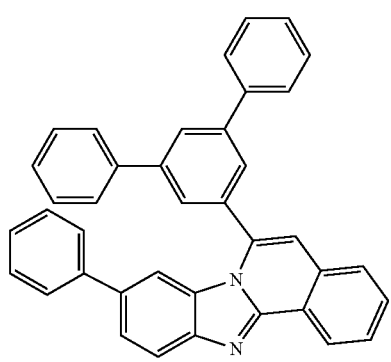
(93)
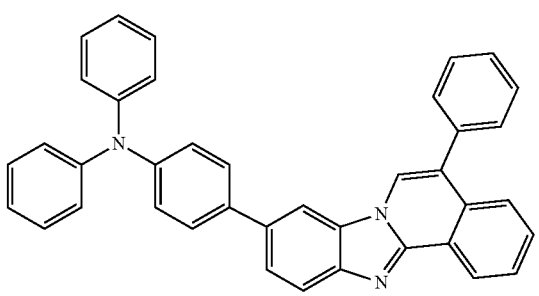
(90)
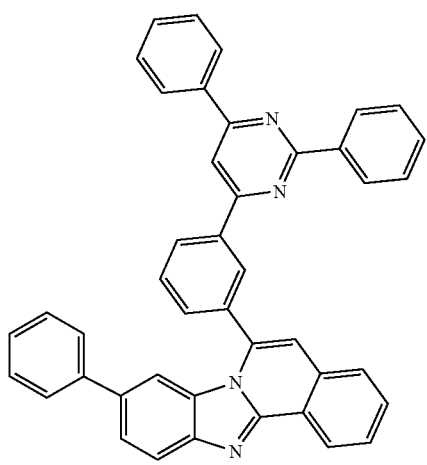
(94)
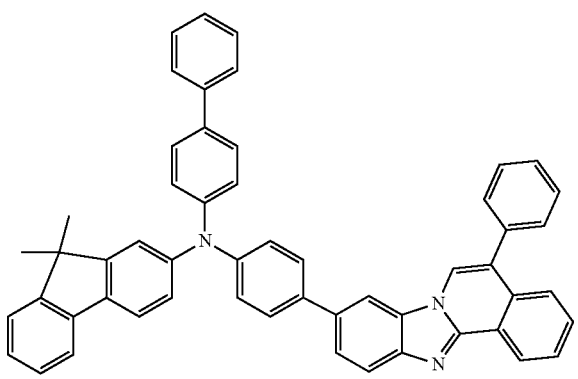
(91)
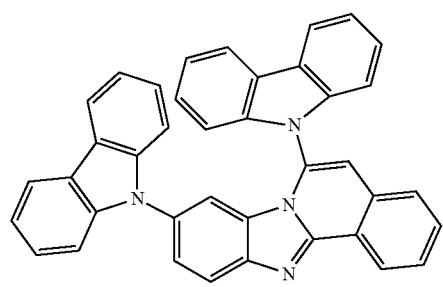
(95)

(96)
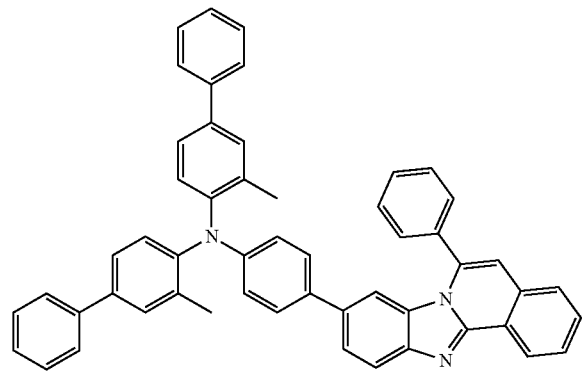
(96)
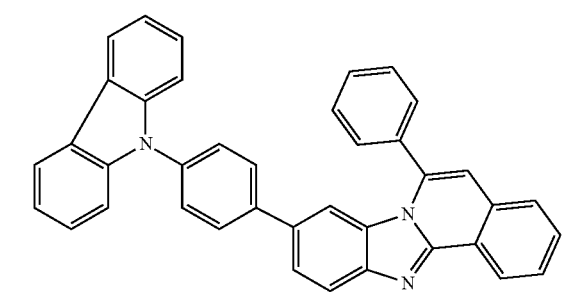
(97)
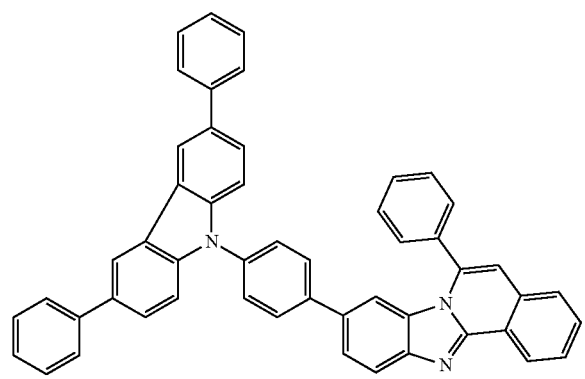
(99)
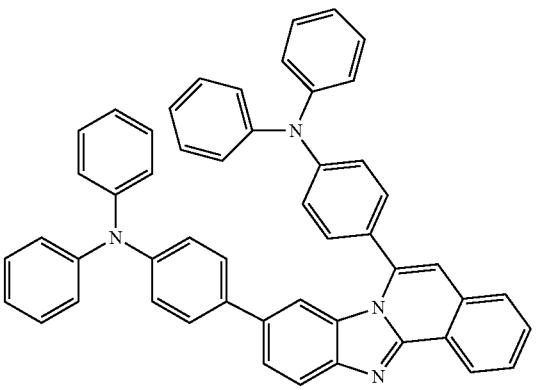
(100)
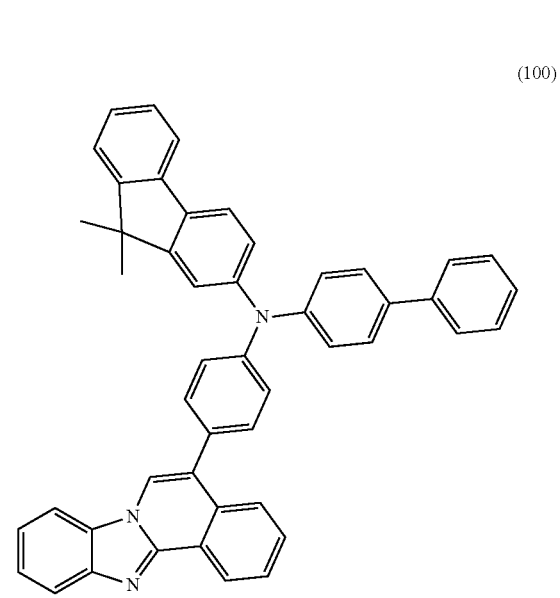
(101)
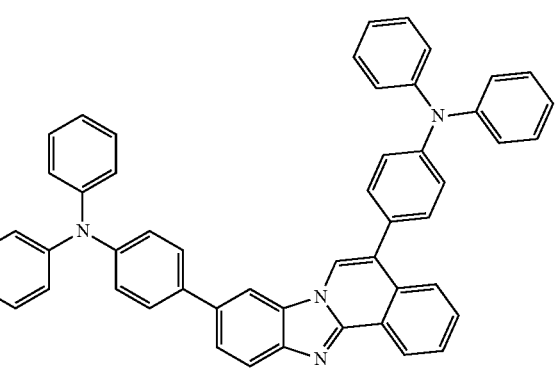

-continued
(101)
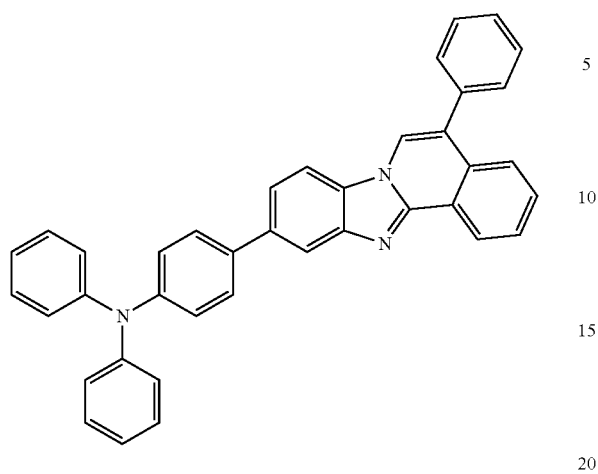
(102)
(103)
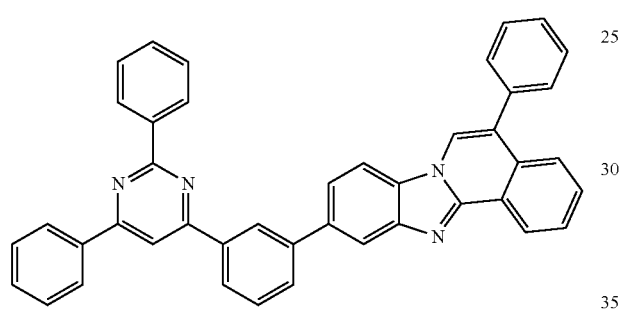
(104)
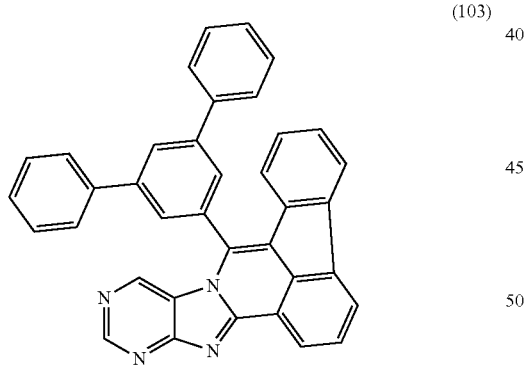
-continued
(105)
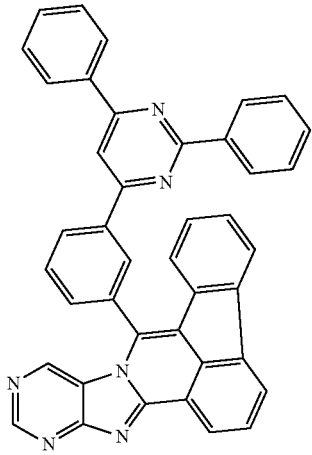
(106)
(107)
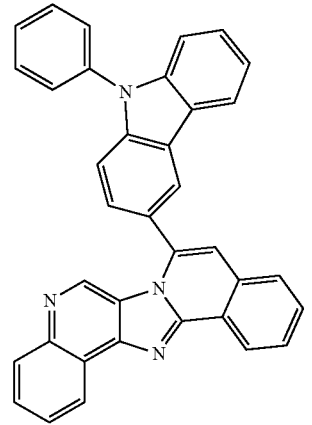

(108)
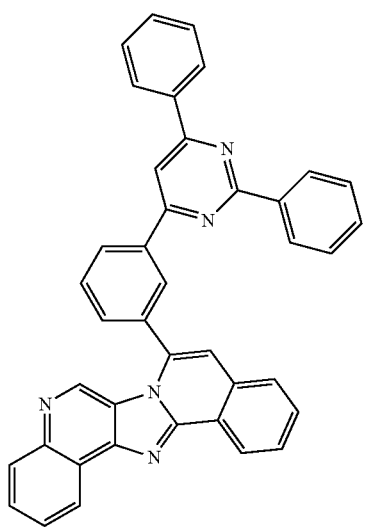
(109)
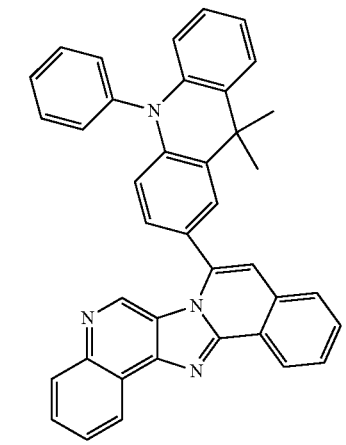
(110)
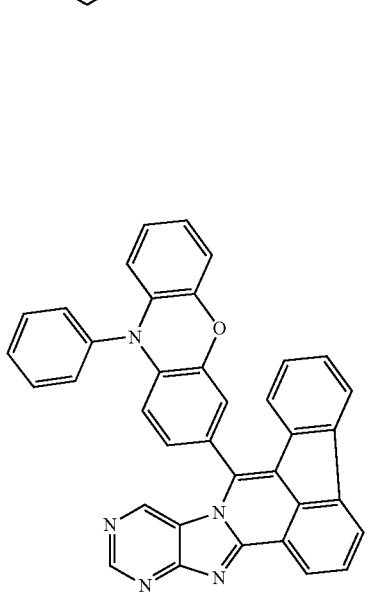
(111)
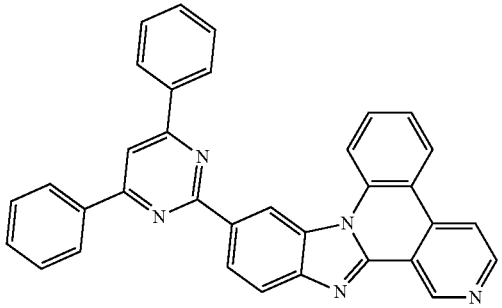
(112)
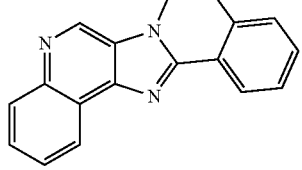
(113)
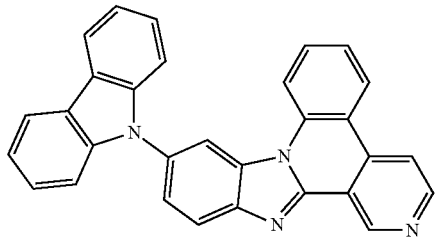
(114)
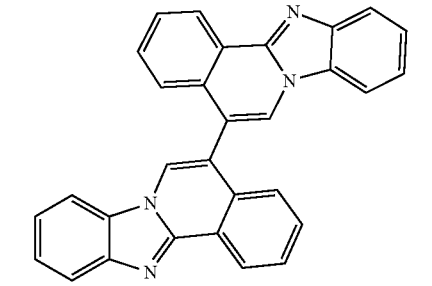
(115)
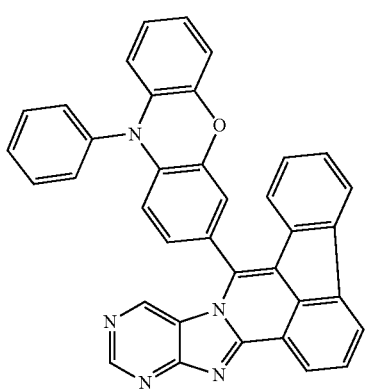

(116)
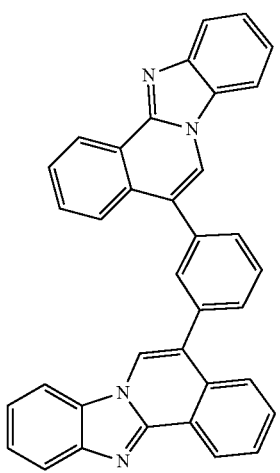
(119)
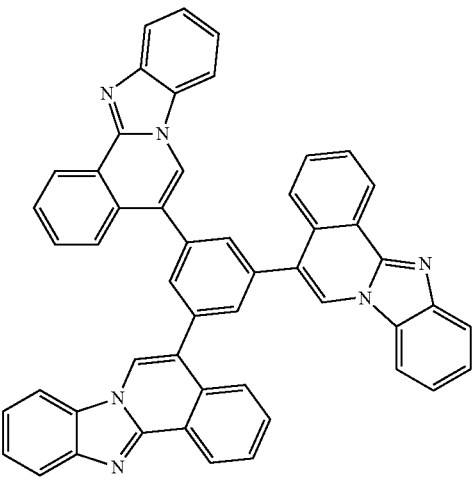
(117)
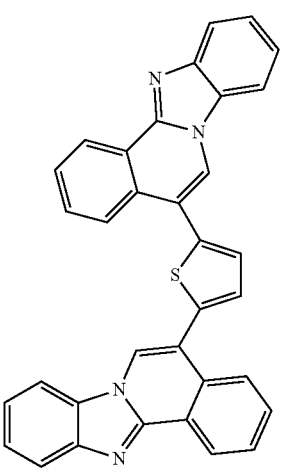
(120)
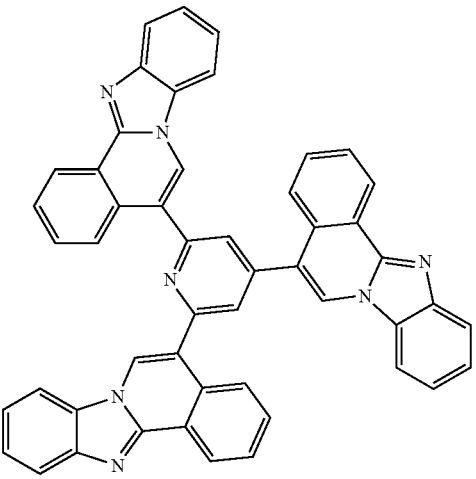
(118)
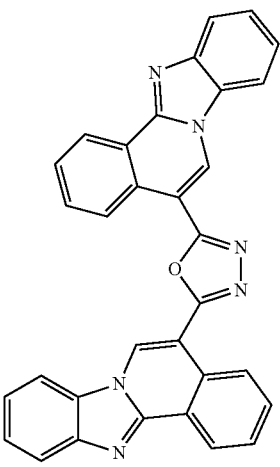
(121)
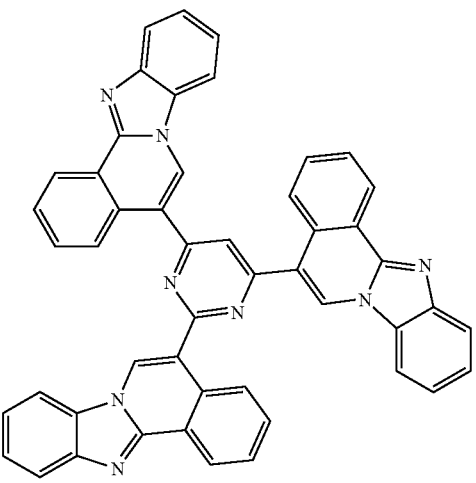

(122)
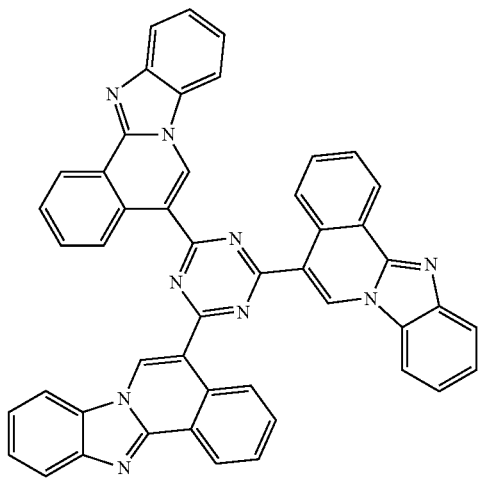

(123)
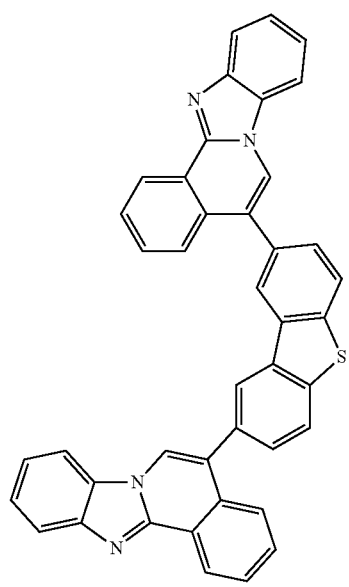

(124)
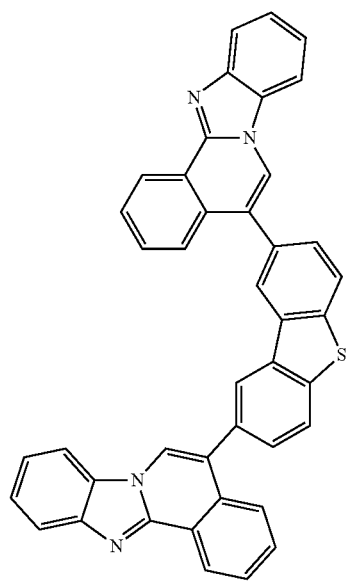

(125)
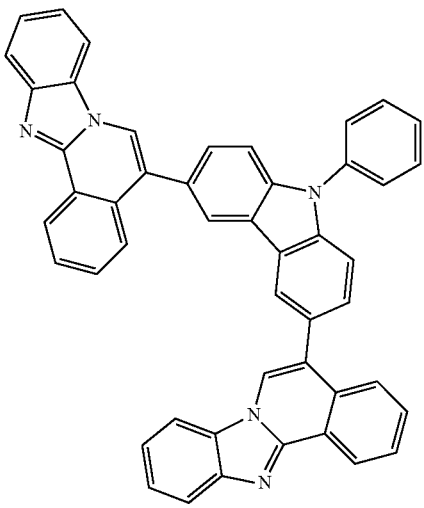

(126)
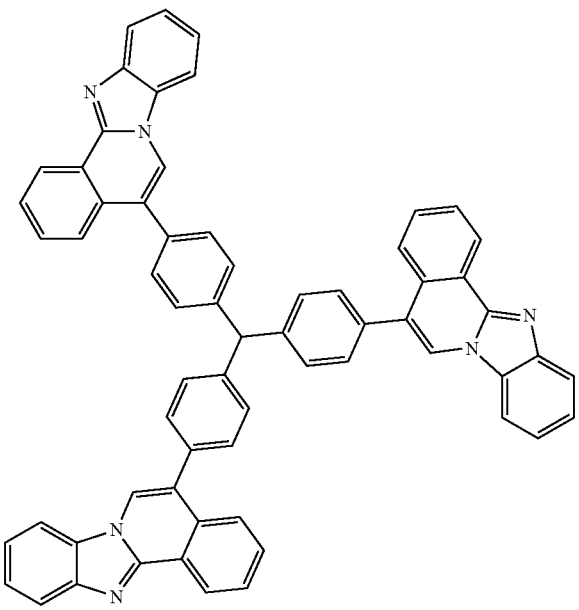

The synthesis of the compounds of the formula (1) is carried out starting from compounds which are known from the literature, as depicted below. The synthesis of the basic building blocks of the compounds of the formula (1) or formula (2) is known from WO 2011/157339. In particular, the halogenated, in particular the brominated basic building blocks are suitable as starting material for the synthesis of the compounds of the formula (1) or formula (2). These can be converted into the compounds of the formula (1) or formula (2) by standard reactions of organic chemistry, such as, for example, Suzuki coupling, Hartwig-Buchwald coupling, etc.

The organic electroluminescent device comprises cathode, anode and at least one emitting layer. Apart from these layers, it may also comprise further layers, for example in each case one or more hole-injection layers, hole-transport layers, hole-blocking layers, electron-transport layers, electron-injection layers, exciton-blocking layers, electron-blocking layers and/or charge-generation layers. It is likewise possible for interlayers, which have, for example, an exciton-blocking function, to be introduced between two emitting layers. However, it should be pointed out that each of these layers does not necessarily have to be present. The organic electroluminescent device here may comprise one emitting layer or a plurality of emitting layers. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to systems having three emitting layers, where the three layers exhibit blue, green and orange or red emission (for the basic structure see, for example, WO 2005/011013). These can be fluorescent or phosphorescent emission layers or hybrid systems, in which fluorescent and phosphorescent emission layers are combined with one another.

The compound of the formula (1) or formula (2) can be employed in various layers, depending on the precise structure.

In a preferred embodiment of the invention, the compound of the formula (1) or formula (2) or according to one of the preferred embodiments is employed as matrix material for a fluorescent or phosphorescent compound, in particular for a phosphorescent compound, in an emitting layer. The organic electroluminescent device here may comprise one emitting layer or a plurality of emitting layers, where at least one emitting layer comprises at least one compound of the formula (1) or formula (2) or according to one of the preferred embodiments as matrix material.

If the compound of the formula (1) or formula (2) or according to one of the preferred embodiments is employed as matrix material for an emitting compound in an emitting layer, it is preferably employed in combination with one or more phosphorescent materials (triplet emitters). Phosphorescence in the sense of this invention is taken to mean the luminescence from an excited state having relatively high spin multiplicity, i.e. a spin state>1, in particular from an excited triplet state. For the purposes of this application, all luminescent transition-metal complexes and luminescent lanthanide complexes, in particular all iridium, platinum and copper complexes, are to be regarded as phosphorescent compounds.

The mixture comprising the compound of the formula (1) or formula (2) or according to one of the preferred embodiments and the emitting compound comprises between 99 and 1% by vol., preferably between 98 and 10% by vol., particularly preferably between 97 and 60% by vol., in particular between 95 and 80% by vol., of the compound of the formula (1) or formula (2) or according to one of the preferred embodiments, based on the entire mixture comprising emitter and matrix material. Correspondingly, the mixture comprises between 1 and 99% by vol., preferably between 2 and 90% by vol., particularly preferably between 3 and 40% by vol., in particular between 5 and 20% by vol., of the emitter, based on the entire mixture comprising emitter and matrix material.

A further preferred embodiment of the present invention is the use of the compound of the formula (1) or formula (2) or according to one of the preferred embodiments as matrix material for a phosphorescent emitter in combination with a further matrix material. Particularly suitable matrix materials which can be employed in combination with the compounds of the formula (1) or formula (2) or according to one of the preferred embodiments are aromatic ketones, aromatic phosphine oxides or aromatic sulfoxides or sulfones, for example in accordance with WO 2004/013080, WO 2004/093207, WO 2006/005627 or WO 2010/006680, triarylamines, carbazole derivatives, for example CBP (N,N-biscarbazolylbiphenyl) or the carbazole derivatives disclosed in WO 2005/039246, US 2005/0069729, JP 2004/288381, EP 1205527 or WO 2008/086851, indolocarbazole derivatives, for example in accordance with WO 2007/063754 or WO 2008/056746, indenocarbazole derivatives, for example in accordance with WO 2010/136109 and WO 2011/000455, azacarbazole derivatives, for example in accordance with EP 1617710, EP 1617711, EP 1731584, JP 2005/347160, bipolar matrix materials, for example in accordance with WO 2007/137725, silanes, for example in accordance with WO 2005/111172, azaboroles or boronic esters, for example in accordance with WO 2006/117052, triazine derivatives, for example in accordance with WO 2010/015306, WO 2007/063754 or WO 2008/056746, zinc complexes, for example in accordance with EP 652273 or WO 2009/062578, diazasilole or tetraazasilole derivatives, for example in accordance with WO 2010/054729, diazaphosphole derivatives, for example in accordance with WO 2010/054730, or bridged carbazole derivatives, for example in accordance with US 2009/0136779, WO 2010/050778, WO 2011/042107 or WO 2011/088877. A further phosphorescent emitter which emits at shorter wavelength than the actual emitter may likewise be present in the mixture as co-host.

Suitable phosphorescent compounds (=triplet emitters) are, in particular, compounds which emit light, preferably in the visible region, on suitable excitation and in addition contain at least one atom having an atomic number greater than 20, preferably greater than 38 and less than 84, particularly preferably greater than 56 and less than 80, in particular a metal having this atomic number. The phosphorescent emitters used are preferably compounds which contain copper, molybdenum, tungsten, rhenium, ruthenium, osmium, rhodium, iridium, palladium, platinum, silver, gold or europium, in particular compounds which contain iridium or platinum. For the purposes of the present invention, all luminescent compounds which contain the above-mentioned metals are regarded as phosphorescent compounds.

Examples of the emitters described above are revealed by the applications WO 00/70655, WO 2001/41512, WO 2002/02714, WO 2002/15645, EP 1191613, EP 1191612, EP 1191614, WO 05/033244, WO 05/019373, US 2005/0258742, WO 2009/146770, WO 2010/015307, WO 2010/031485, WO 2010/054731, WO 2010/054728, WO 2010/086089, WO 2010/099852, WO 2010/102709, WO 2011/032626, WO 2011/066898, WO 2011/157339 and WO 2012/007086. In general, all phosphorescent complexes as used in accordance with the prior art for phosphorescent OLEDs and as are known to the person skilled in the art in the area of organic electroluminescence are suitable, and the person skilled in the art will be able to use further phosphorescent complexes without inventive step.

In a further embodiment of the invention, the organic electroluminescent device according to the invention does not comprise a separate hole-injection layer and/or hole-transport layer and/or hole-blocking layer and/or electron-transport layer, i.e. the emitting layer is directly adjacent to the hole-injection layer or the anode, and/or the emitting layer is directly adjacent to the electron-transport layer or the electron-injection layer or the cathode, as described, for example, in WO 2005/053051. It is furthermore possible to use a metal complex which is identical or similar to the metal complex in the emitting layer as hole-transport or hole-injection material directly adjacent to the emitting layer, as described, for example, in WO 2009/030981.

In a further preferred embodiment of the invention, the compound of the formula (1) or formula (2) or according to one of the preferred embodiments is employed as electron-transport material in an electron-transport or electron-injection layer. At least one substituent R or $R^1$ here is preferably selected from structures of the formulae (13) to (24) indicated above. The emitting layer here may be fluorescent or phosphorescent. If the compound is employed as electron-transport material, it may be preferred for it to be doped, for example with alkali-metal complexes, such as, for example, Liq (lithium hydroxyquinolinate).

In still a further preferred embodiment of the invention, the compound of the formula (1) or formula (2) or according to one of the preferred embodiments is employed in a hole-blocking layer. At least one substituent R or $R^1$ here is preferably selected from structures of the formulae (13) to (24) indicated above. A hole-blocking layer is taken to mean a layer which is directly adjacent to an emitting layer on the cathode side, in particular in a phosphorescent electroluminescent device.

It is furthermore possible to use the compound of the formula (1) or formula (2) or according to one of the preferred embodiments both in a hole-blocking layer or electron-transport layer and also as matrix in an emitting layer. At least one substituent R or $R^1$ here is preferably selected from structures of the formulae (13) to (24) indicated above.

In still a further preferred embodiment of the invention, the compound of the formula (1) or formula (2) or according to one of the preferred embodiments is employed in a hole-transport layer or in a hole-injection layer or in an electron-blocking layer or exciton-blocking layer. At least one substituent R or $R^1$ here is preferably selected from structures of the formulae (25) to (42) indicated above.

In the further layers of the organic electroluminescent device according to the invention, it is possible to use all materials as usually employed in accordance with the prior art. The person skilled in the art will therefore be able, without inventive step, to employ all materials known for organic electroluminescent devices in combination with the compounds of the formula (1) or formula (2) or according to one of the preferred embodiments.

Preference is furthermore given to an organic electroluminescent device, characterised in that one or more layers are coated by means of a sublimation process, in which the materials are vapour-deposited in vacuum sublimation units at an initial pressure of less than $10^{-5}$ mbar, preferably less than $10^{-6}$ mbar. However, it is also possible for the initial pressure to be even lower or higher, for example less than $10^{-7}$ mbar.

Preference is likewise given to an organic electroluminescent device, characterised in that one or more layers are coated by means of the OVPD (organic vapour phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, ink-jet printing, LITI (light induced thermal imaging, thermal transfer printing), screen printing, flexographic printing, offset printing or nozzle printing. Soluble compounds, which are obtained, for example, by suitable substitution, are necessary for this purpose. These processes are also particularly suitable for oligomers, dendrimers and polymers.

Also possible are hybrid processes, in which, for example, one or more layers are applied from solution and one or more further layers are applied by vapour deposition. Thus, it is possible, for example, to apply the emitting layer from solution and to apply the electron-transport layer by vapour deposition.

The present application therefore furthermore relates to a process for the production of an organic electrluminescent device according to the invention, characterised in that at least one layer is applied by a sublimation process or in that at least one layer is applied by the OVPD process or in that at least one layer is applied from solution of by any desired printing process.

The organic electroluminescent devices according to the invention are distinguished over the prior art by the following surprising advantages:

1. The organic electroluminescent device according to the invention comprising compounds of the formula (1) or formula (2) as matrix material for fluorescent or phosphorescent emitters, result in high efficiencies and long lifetimes. This applies, in particular, if the compounds are employed as matrix material for a phosphorescent emitter.
2. The compounds of the formula (1) or formula (2) have high thermal stability, which is advantageous for the production of the organic electroluminescent device according to the invention.
3. Organic electroluminescent devices comprising compounds of the formula (1) or formula (2) result in high efficiencies and in steep current/voltage curves with low use voltages.
4. Also on use as electron-transport material or as hole-transport material, the compounds of the formula (1) or formula (2) result in good properties with respect to the efficiency, the lifetime and the operating voltage of organic electroluminescent devices.

These above-mentioned advantages are not accompanied by an impairment in the other electronic properties.

The invention is explained in greater detail by the following examples, without wishing to restrict it thereby. The person skilled in the art will be able to carry out the invention throughout the range disclosed on the basis of the descriptions and produce further organic electroluminescent devices according to the invention.

EXAMPLES

The following syntheses are carried out, unless indicated otherwise, in dried solvents under a protective-gas atmosphere. The solvents and reagents can be purchased, for example, from Sigma-ALDRICH or ABCR. The numbers in square brackets for chemical compounds which are known from the literature relate to the CAS number.

Example 1

Synthesis of the Bromides

1a) Synthesis of 9-bromobenzimidazo[2,1-a]isoquinoline

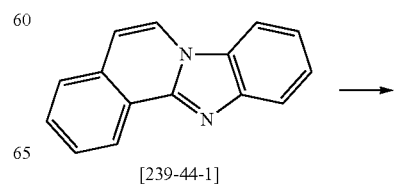

[239-44-1]

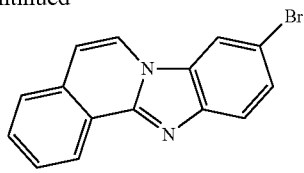

32.6 g (183 mmol) of NBS are added to a solution of 40 g (183 mmol) of benzimidazo[2,1-a]isoquinoline in 500 ml of THF, and the mixture is stirred at 60° C. for 4 h. The solution is subsequently stirred at room temperature overnight, the solid is filtered off with suction, washed with ethanol and dried. Yield: 51.3 g (181 mmol), 98%.

1b) Synthesis of 5,9-dibromobenzimidazo[2,1-a]isoquinoline

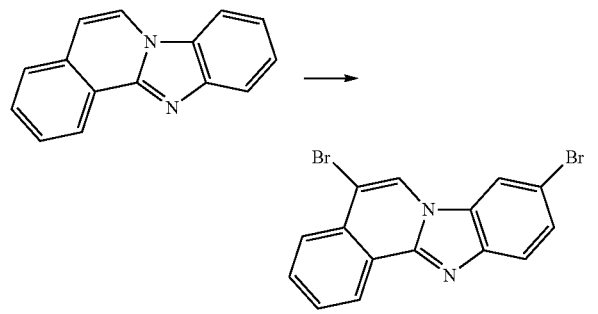

62 g (183 mmol) of NBS are added to a solution of 38 g (174 mmol) of benzimidazo[2,1-a]isoquinoline in 500 ml of DMF, and the mixture is stirred at 80° C. for 4 h. The solution is subsequently stirred at room temperature overnight, the solid is filtered off with suction, washed with ethanol and dried. Yield: 52.4 g (139 mmol), 80%.

1c) 5,9,11-Tribromobenzimidazo[2,1-a]isoquinolines

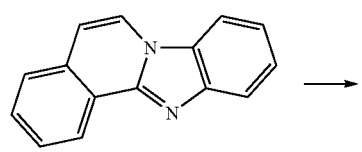

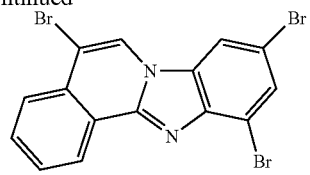

146.7 g (824 mmol) of NBS are added to a solution of 40 g (183 mmol) of benzimidazo[2,1-a]isoquinoline in 400 ml of DMF, and the mixture is stirred at 120° C. for 4 h. The solution is subsequently stirred at room temperature overnight, the solid is filtered off with suction, washed with ethanol and dried. Yield: 54 g (118 mmol), 65%.

Example 2

Synthesis of the boronic acid derivatives

2a) Synthesis of 9-(4,4,5,5-tetramethyl-1,3,2-dioxaborolan-2-yl)-benzo[4,5]imidazo[2,1-a]isoquinoline

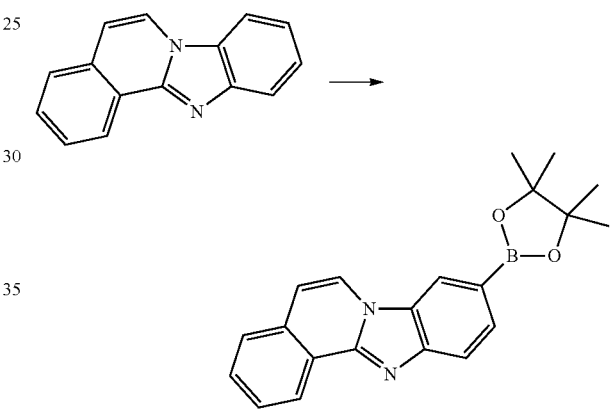

35 g (161 mmol) of 9-bromobenzimidazo[2,1-a]isoquinoline, 53.3 g (210 mmol) of bis(pinacolato)diborane and 26 g (274 mmol) of potassium acetate are suspended in 800 ml of dioxane. 11.9 g (16.1 mmol) of 1,1-bis-(diphenylphosphino)ferrocenepalladium(II) dichloride in dichloromethane are added to this suspension. The reaction mixture is heated under reflux for 16 h. After cooling, the organic phase is separated off, washed three times with 150 ml of water and subsequently evaporated to dryness. The residue is recrystallised from toluene. The yield is 50.2 g (146 mmol, 91%).

Compounds 2b and 2c are obtained analogously:

| Ex. | Starting material 1 | Product | Yield |
|---|---|---|---|
| 2b |  |  | 84% |

| Ex. | Starting material 1 | Product | Yield |
|---|---|---|---|
| 2c | | | 79% |

Example 3

Suzuki Coupling

3a) Synthesis of 9-biphenyl-2-ylbenzo[4,5]imidazo[2,1-a]isoquinoline

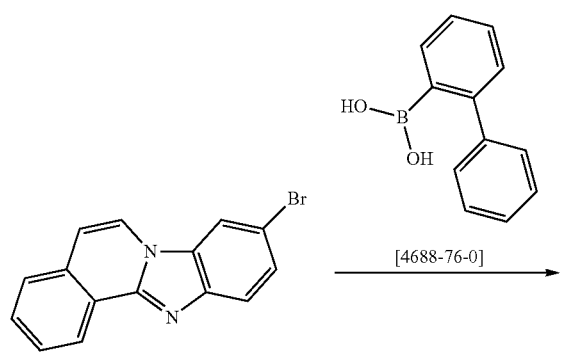

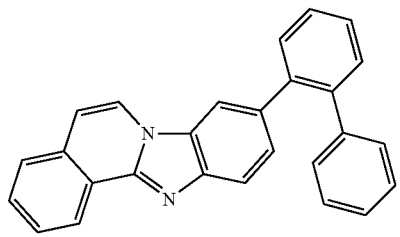

913 mg (3 mmol) of tri-o-tolylphosphine and then 112 mg (0.5 mmol) of palladium(II) acetate are added to a vigorously stirred suspension of 14.8 g (50 mmol) of 9-bromobenzimidazo[2,1-a]isoquinoline, 9.9 g (55 mmol) of 1,1'-biphenyl-2-boronic acid and 25.5 g (120 mmol) of tri-potassium phosphate in a mixture of 300 ml of toluene, 100 ml of dioxane and 400 ml of water, and the mixture is subsequently heated under reflux for 16 h. After cooling, the precipitated solid is filtered off with suction, washed three times with 50 ml of toluene, three times with 50 ml of ethanol:water (1:1, v:v), three times with 100 ml of ethanol and finally dried. The residue is recrystallised from toluene. The yield is 17 g (45 mmol, 92%).

Compounds 3b-3j are obtained analogously:

| Ex. | Starting material 1 | Starting material 2 |
|---|---|---|
| 3b | | |

| | | |
|---|---|---|
| 3c | 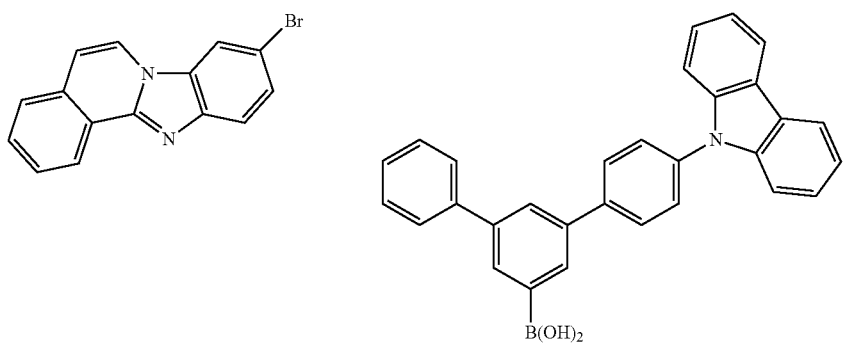 | [784-42-4] |
| 3e | 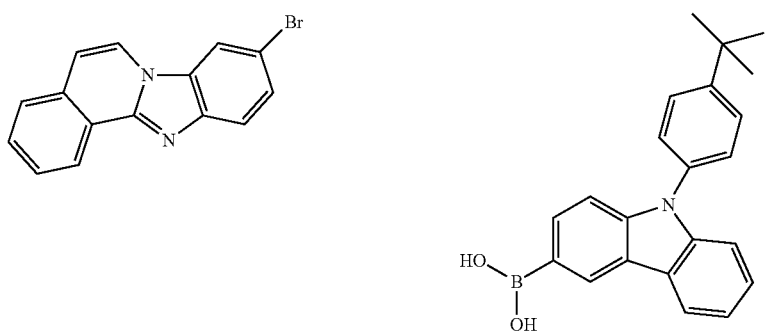 | [1133057-96-1] |
| 3f | 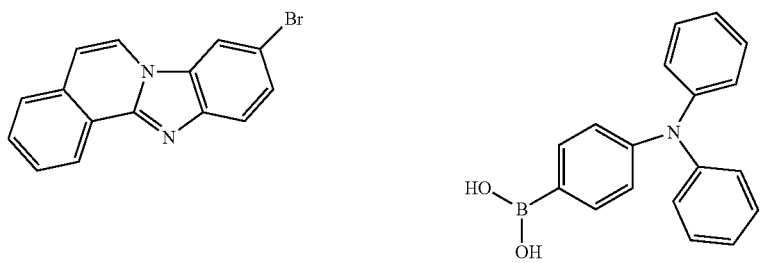 | [201802-67-7] |
| 3h | 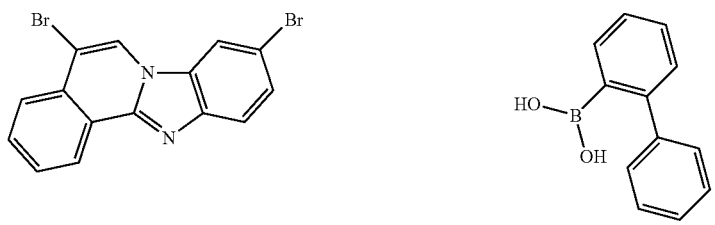 | [4688-76-0] |
| 3i | 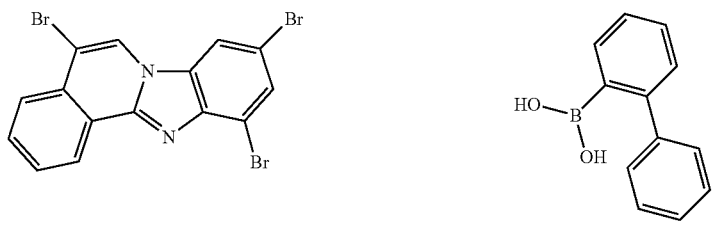 | |

-continued
| | | |
|---|---|---|
| 3j | 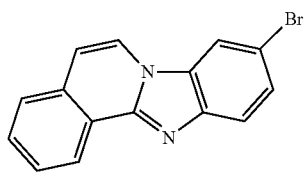 [SMILES: Brc1ccc2nc3c4ccccc4ccn3c2c1] | 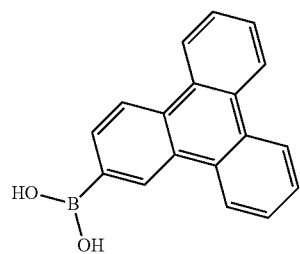 [SMILES: OB(O)c1ccc2c3ccccc3c3ccccc3c2c1]
[654664-63-8] |
| Ex. | Product | Yield |
|---|---|---|
| 3b | 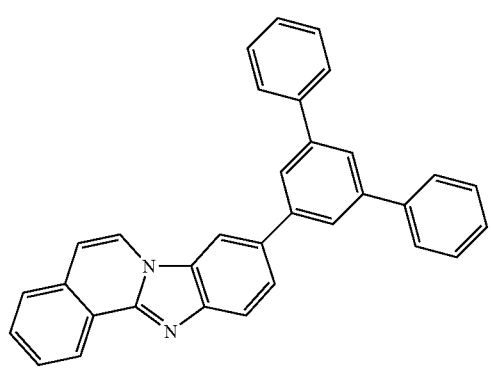 [SMILES: c1ccc(-c2cc(-c3ccccc3)cc(-c3ccc4nc5c6ccccc6ccn5c4c3)c2)cc1] | 89% |
| 3c | 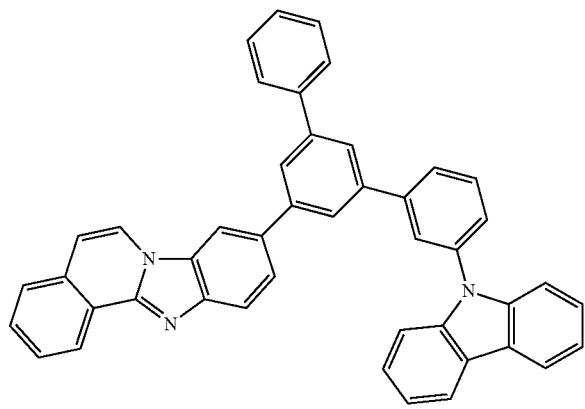 [SMILES: c1ccc(-c2cc(-c3cccc(-n4c5ccccc5c5ccccc54)c3)cc(-c3ccc4nc5c6ccccc6ccn5c4c3)c2)cc1] | 82% |
| 3e | 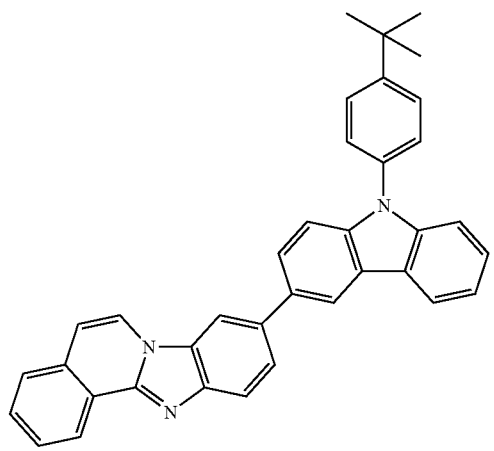 [SMILES: CC(C)(C)c1ccc(-n2c3ccccc3c3cc(-c4ccc5nc6c7ccccc7ccn6c5c4)ccc32)cc1] | 77% |

-continued
| | | |
|---|---|---|
| 3f | 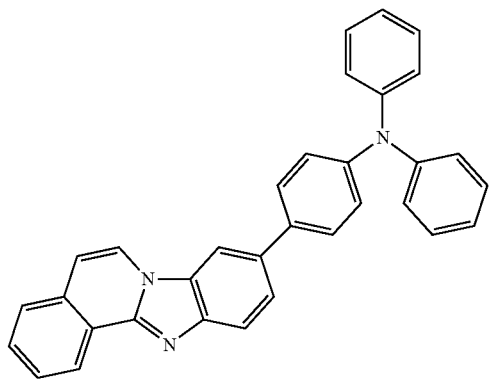 [SMILES: c1ccc(N(c2ccccc2)c2ccc(-c3ccc4nc5c6ccccc6ccn5c4c3)cc2)cc1] | 76% |
| 3h | 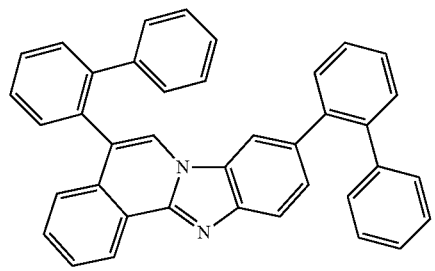 [SMILES: c1ccc(-c2ccccc2-c2ccc3nc4c5ccccc5c(-c5ccccc5-c5ccccc5)cn4c3c2)cc1] | 75% |
| 3i | 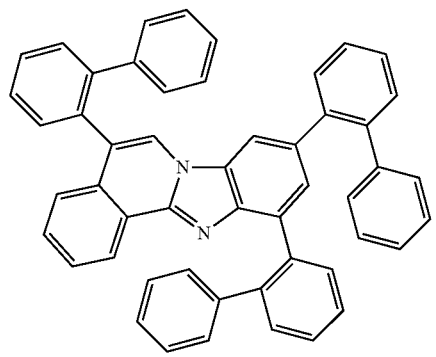 [SMILES: c1ccc(-c2ccccc2-c2cc(-c3ccccc3-c3ccccc3)c3nc4c5ccccc5c(-c5ccccc5-c5ccccc5)cn4c3c2)cc1] | 68% |
| 3j | 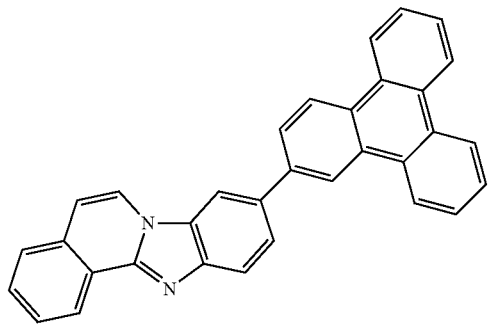 [SMILES: c1ccc2c(c1)ccn1c3cc(-c4ccc5c6ccccc6c6ccccc6c5c4)ccc3nc21] | 66% |

Example 4

Synthesis of 4-(2-bromophenyl)-2,6-diphenylpyrimidine

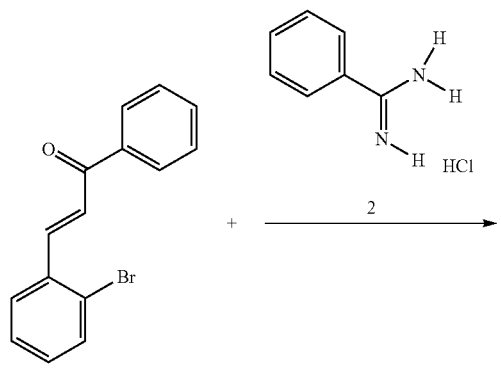

23 g (409 mmol) of potassium hydroxide are dissolved in 500 ml of ethanol, 40 g (255 mmol) of benzamidine hydrochloride 2 and 129 g (452 mmol) of (3-(bromophenyl)-1-phenyl-2-propen-1-one 1, dissolved in 500 ml of ethanol, are added at room temperature, and the mixture is stirred under reflux for 3 h. After cooling to room temperature, the precipitated solid is filtered off with suction, washed with a little ethanol and dried, leaving 55 g (129 mmol), 50%, of the product in the form of colourless crystals.

Example 5

Synthesis of (3'-bromobiphenyl-3-yl)phenylmethanone

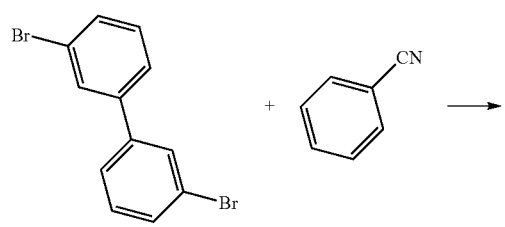

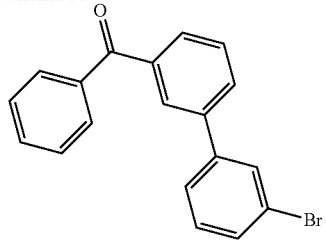

The corresponding Grignard reagent is prepared from a solution of 31.5 g (101 mmol) of 3,3'-dibromobiphenyl and 1 ml of 1,2-dichloroethane in 30 ml of 1,2-dimethoxyethane and 300 ml of THF and 2.8 g (115 mmol) of magnesium at the boiling point. A solution of 10.4 g (101 mmol) of benzonitrile in a mixture of 130 ml of THF and 130 ml of toluene is added dropwise to this Grignard solution at 0-5° C. over the course of 20 min. The mixture is subsequently heated under reflux for 16 h. After cooling, the reaction mixture is evaporated to dryness. The solid is taken up in 1000 ml of NMP and heated under reflux for 12 h with 40 ml of water and 2 ml of glacial acetic acid. A mixture of 600 ml of methanol and 600 ml of 1N hydrochloric acid is added, and the precipitated solid is separated off by filtration and dried. The crude product is recrystallised from toluene/heptane. The yield, at a purity >98% according to HPLC, is 27.1 g (80.5 mmol) corresponding to 80% of theory.

Example 6

Synthesis of bis-(3'-bromobiphenyl-3-yl)methanone

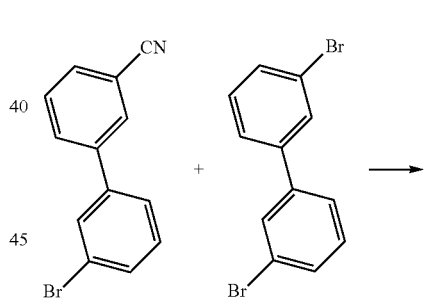

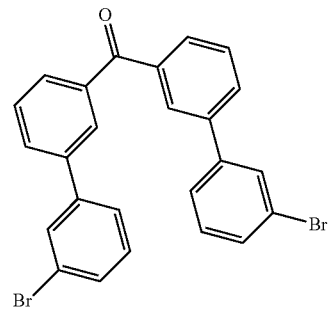

The corresponding Grignard reagent is prepared from a solution of 31.5 g (101 mmol) of 3,3'-dibromobiphenyl, 1 ml of 1,2-dichloroethane and 30 ml of 1,2-dimethoxyethane in 300 ml of THF and 2.8 g (115 mmol) of magnesium at the boiling point. A solution of 26.06 g (101 mmol) of 3-bromo-3'-cyanobiphenyl in a mixture of 130 ml of THF and 130 ml of toluene is added dropwise to this Grignard solution at 0-5° C. over the course of 20 min. The mixture is subsequently heated under reflux for 16 h. After cooling, the reaction mixture is evaporated to dryness. The solid is taken up in 1100 ml of NMP and heated under reflux for 24 h with 40 ml of water and 5 ml of glacial acetic acid. A mixture of 600 ml of methanol and 600 ml of 1N hydrochloric acid is added, and the precipitated solid is separated off by filtration and dried. The crude product is recrystallised three times from toluene/heptane. The yield, at a purity >97% according to HPLC, is 34.8 g (70.7 mmol), corresponding to 70% of theory.

Example 7

9-[3-(2,6-Diphenylpyrimidin-4-yl)phenyl]benz[4,5]-imidazo[2,1-a]isoquinoline

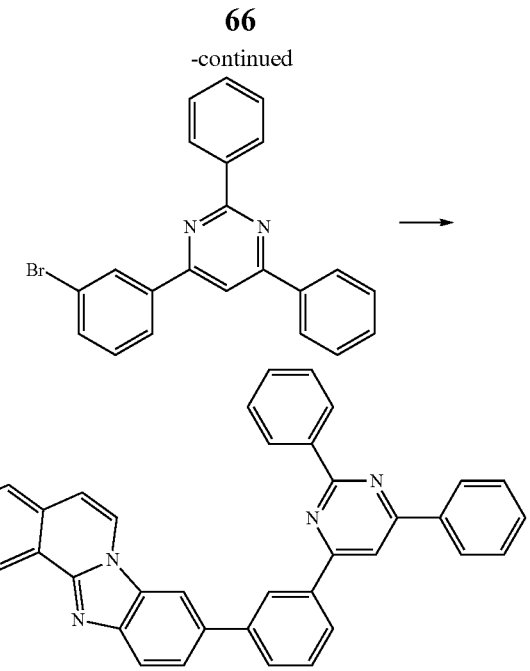

16 g (43.3 mmol) of 2-(3-bromophenyl)-4,6-diphenylpyrimidine and 16.5 g (48 mmol) of 9-(4,4,5,5-tetramethyl-1,3,2-dioxaborolan-2-yl)benz[4,5]-imidazo[2,1-a]isoquinoline are dissolved in 80 ml of toluene and degassed. 281 ml of a degassed 2M K$_2$CO$_3$ and 2.5 g (2.2 mmol) of Pd(OAc)$_2$ are added. The reaction mixture is subsequently stirred at 80° C. for 48 h under protective-gas atmosphere. Additional toluene is added to the cooled solution, which is washed a number of times with water, dried and evaporated. The product is purified by column chromatography on silica gel with toluene/heptane (1:2). Ther purity is 99.9%. Yield: 19.6 g (37 mmol) 77% of theory.

Compounds 7a-7m are obtained analogously:

| Ex. | Starting material 1 | Starting material 2 |
|---|---|---|
| 7a | | |

[864377-286]

| | | |
|---|---|---|
| 7b | 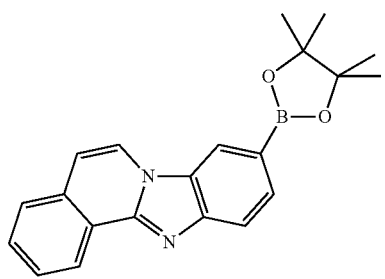 [SMILES: CC1(C)OB(c2ccc3nc4c5ccccc5ccn4c3c2)OC1(C)C] | 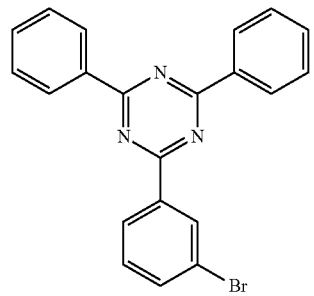 [SMILES: Brc1cccc(-c2nc(-c3ccccc3)nc(-c3ccccc3)n2)c1]
[864377-31-1] |
| 7c | 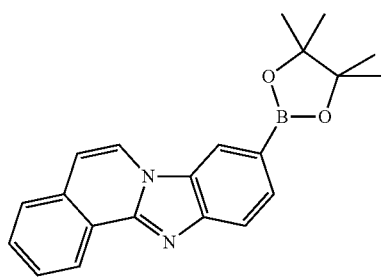 [SMILES: CC1(C)OB(c2ccc3nc4c5ccccc5ccn4c3c2)OC1(C)C] | 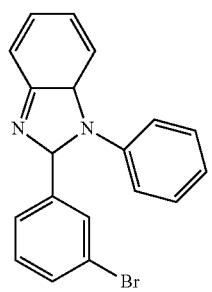 [SMILES: Brc1cccc(C2N=C3C=CC=CC3N2c2ccccc2)c1]
[760212-40-6] |
| 7e | 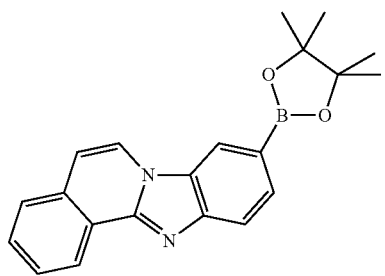 [SMILES: CC1(C)OB(c2ccc3nc4c5ccccc5ccn4c3c2)OC1(C)C] | 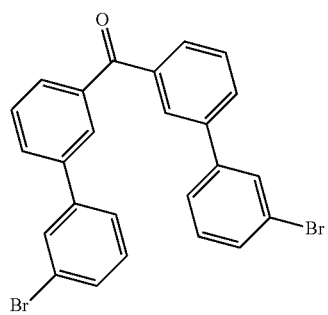 [SMILES: O=C(c1cccc(-c2cccc(Br)c2)c1)c1cccc(-c2cccc(Br)c2)c1] |
| 7f | 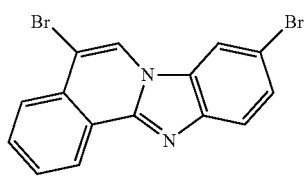 [SMILES: Brc1ccc2nc3c4ccccc4c(Br)cn3c2c1] | 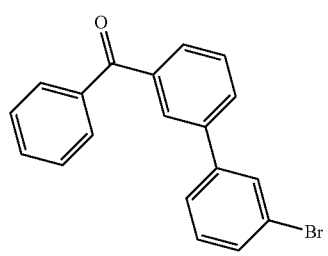 [SMILES: O=C(c1ccccc1)c1cccc(-c2cccc(Br)c2)c1] |
| 7h | 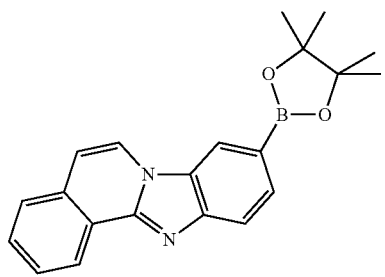 [SMILES: CC1(C)OB(c2ccc3nc4c5ccccc5ccn4c3c2)OC1(C)C] | 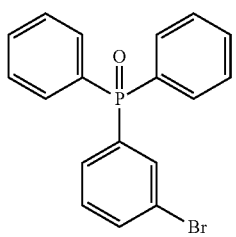 [SMILES: O=P(c1ccccc1)(c1ccccc1)c1cccc(Br)c1]
[10212-04-1] |

-continued
| | | | |
|---|---|---|---|
| 7i | 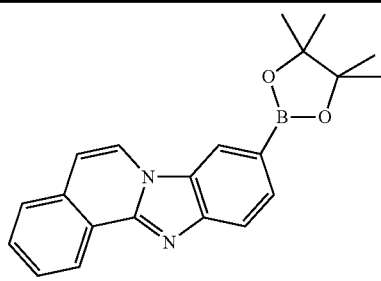 | | 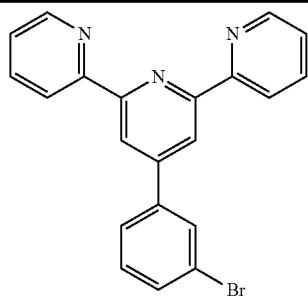 |
| | | | [879879-65-9] |
| 7j | 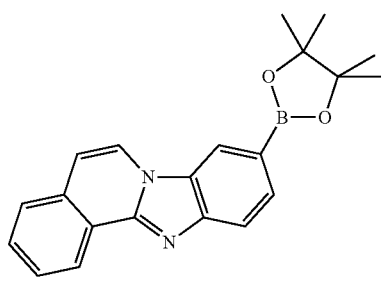 [SMILES: CC1(C)OB(c2ccc3nc4c5ccccc5ccn4c3c2)OC1(C)C] | | 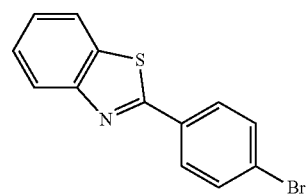 [SMILES: Brc1ccc(-c2nc3ccccc3s2)cc1] |
| | | | [19654-19-4] |
| 7k | 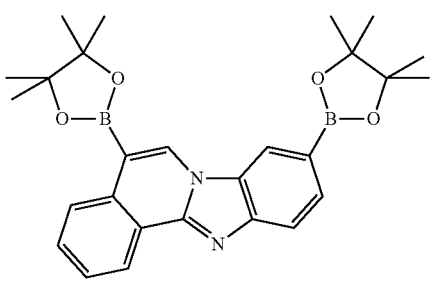 | | 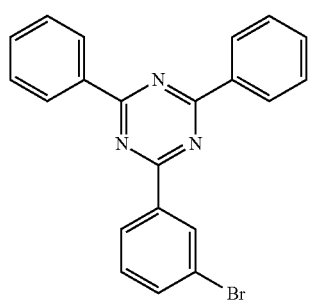 |
| | | | [864377-31-1] |
| 7l | 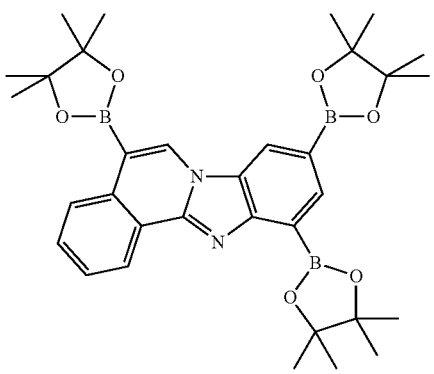 | | 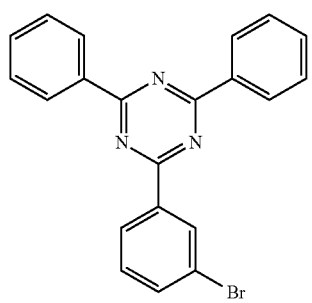 [SMILES: Brc1cccc(-c2nc(-c3ccccc3)nc(-c3ccccc3)n2)c1] |
| | | | [864377-31-1] |
| 7m | 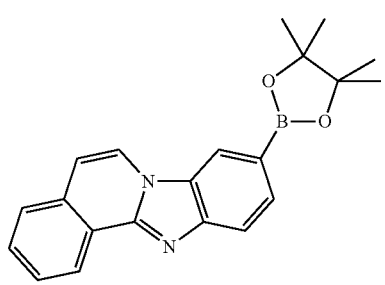 [SMILES: CC1(C)OB(c2ccc3nc4c5ccccc5ccn4c3c2)OC1(C)C] | | 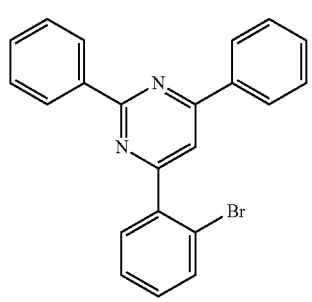 [SMILES: Brc1ccccc1-c1cc(-c2ccccc2)nc(-c2ccccc2)n1] |

-continued
| Ex. | Product | Yield |
|---|---|---|
| 7a | 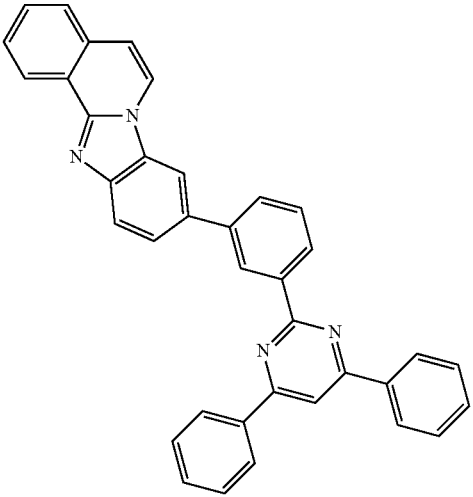 [SMILES: c1ccc(-c2cc(-c3ccccc3)nc(-c3cccc(-c4ccc5nc6c7ccccc7ccn6c5c4)c3)n2)cc1] | 64% |
| 7b | 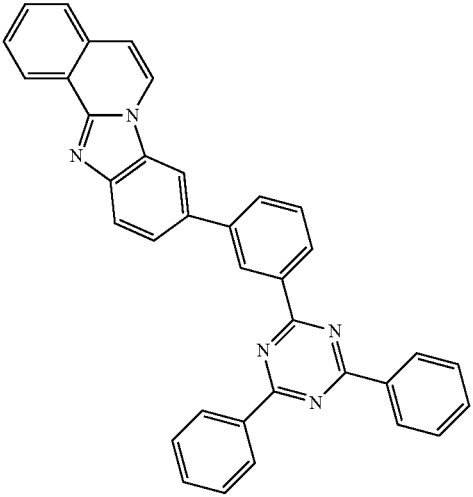 [SMILES: c1ccc(-c2nc(-c3ccccc3)nc(-c3cccc(-c4ccc5nc6c7ccccc7ccn6c5c4)c3)n2)cc1] | 73% |
| 7c | 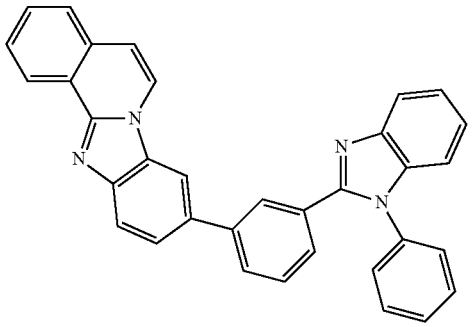 [SMILES: c1ccc(-n2c(-c3cccc(-c4ccc5nc6c7ccccc7ccn6c5c4)c3)nc3ccccc32)cc1] | 72% |

| | | |
|---|---|---|
| 7e | 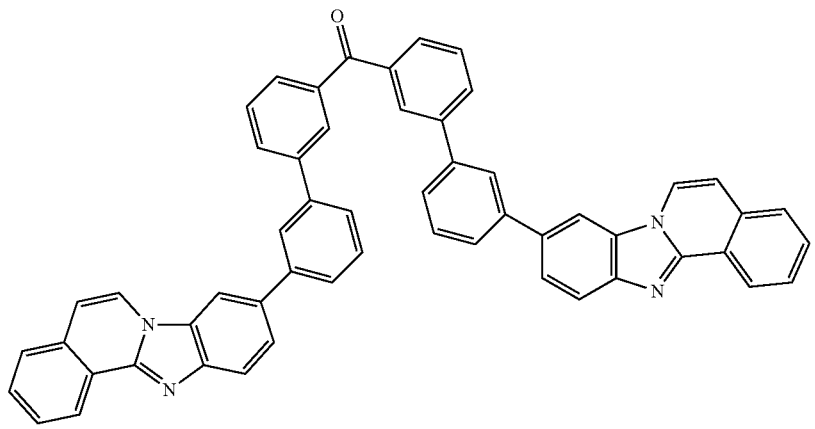 [SMILES: O=C(c1cccc(-c2cccc(-c3ccc4nc5c6ccccc6ccn5c4c3)c2)c1)c1cccc(-c2cccc(-c3ccc4nc5c6ccccc6ccn5c4c3)c2)c1] | 59% |
| 7f | 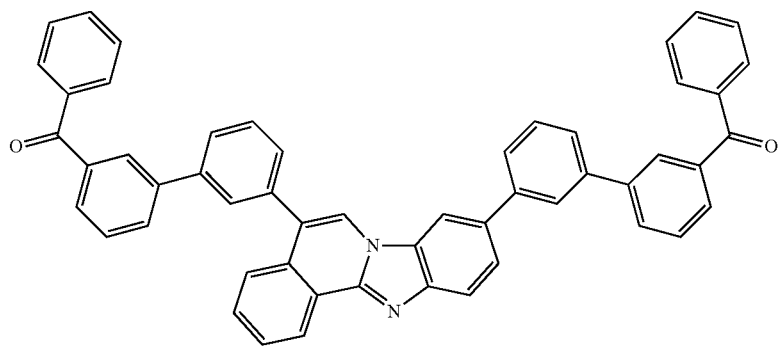 [SMILES: O=C(c1ccccc1)c1cccc(-c2cccc(-c3ccc4nc5c6ccccc6c(-c6cccc(-c7cccc(C(=O)c8ccccc8)c7)c6)cn5c4c3)c2)c1] | 63% |
| 7h | 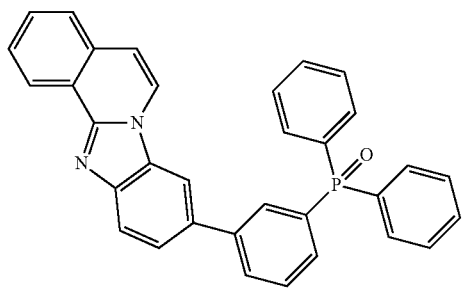 [SMILES: O=P(c1ccccc1)(c1ccccc1)c1cccc(-c2ccc3nc4c5ccccc5ccn4c3c2)c1] | 65% |
| 7i | 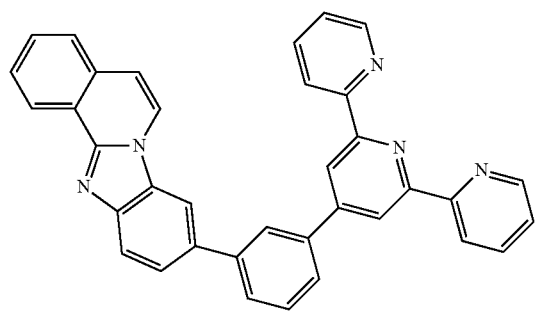 [SMILES: c1ccc(-c2cc(-c3cccc(-c4ccc5nc6c7ccccc7ccn6c5c4)c3)cc(-c3ccccn3)n2)nc1] | 61% |

-continued
| | | |
|---|---|---|
| 7j | 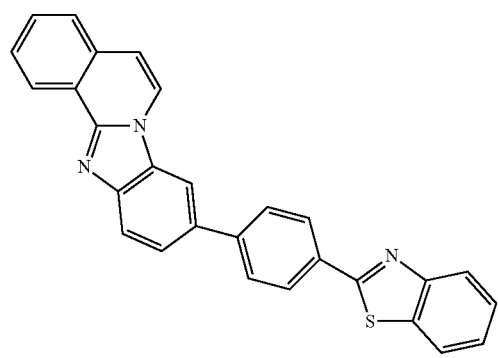 [SMILES: c1ccc2c(c1)ccn1c3cc(-c4ccc(-c5nc6ccccc6s5)cc4)ccc3nc21] | 79% |
| 7k | 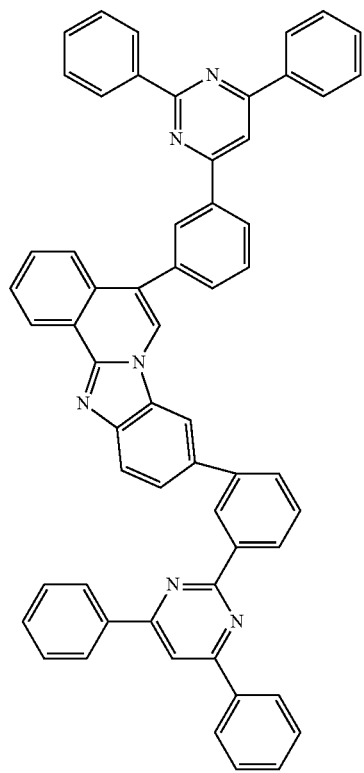 [SMILES: c1ccc(-c2cc(-c3cccc(-c4cn5c6cc(-c7cccc(-c8nc(-c9ccccc9)cc(-c9ccccc9)n8)c7)ccc6nc5c5ccccc45)c3)nc(-c3ccccc3)n2)cc1] | 64% |

| | |
|---|---|
| 7l | 53% |

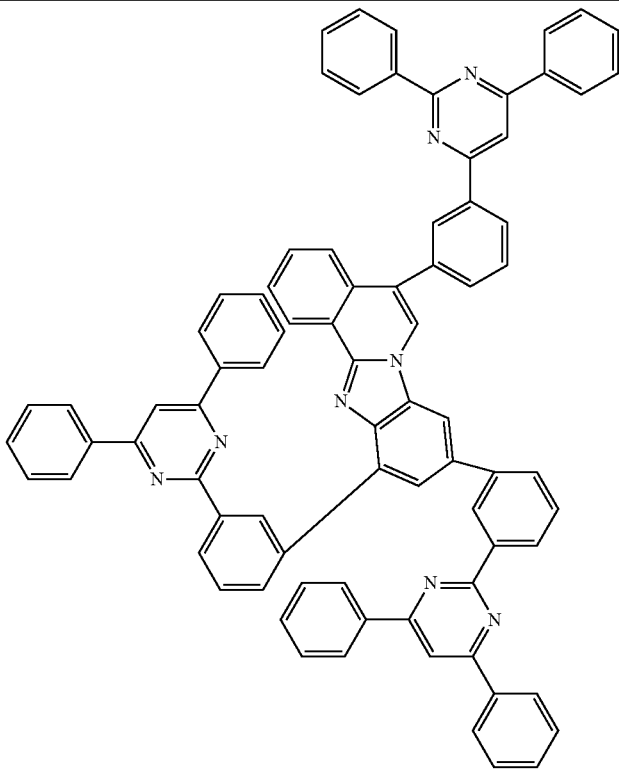

| | |
|---|---|
| 7m | 55% |

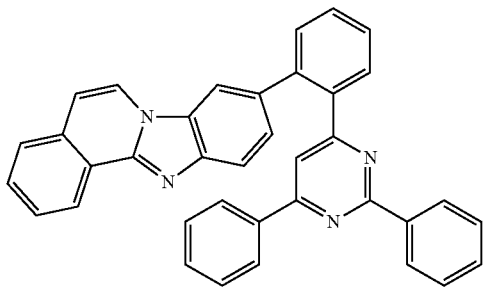 [SMILES: c1ccc(-c2cc(-c3ccccc3-c3ccc4nc5c6ccccc6ccn5c4c3)nc(-c3ccccc3)n2)cc1]

Example 8

9-(9,9-Dimethyl-9H-acridin-10-yl)benz[4,5]imidazo[2,1-a]-isoquinoline

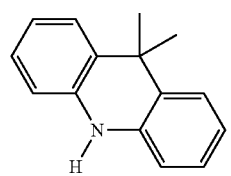

+

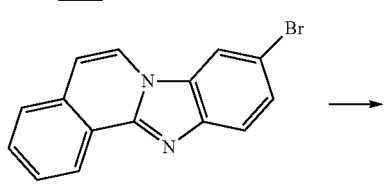

→

-continued

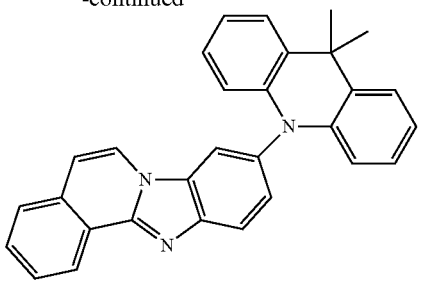

16.7 g (79.8 mmol) of 9,10-dihydro-9,9'dimethylacridine, 25 g (87 mmol) of 9-bromobenzimidazo[2,1-a]isoquinoline and 15.9 ml (15.9 mmol) of 1 mol/l tri-tert-butylphosphine, 1.79 g (7.9 mmol) of palladium acetate are suspended in 120 ml of p-xylene under protective gas. The reaction mixture is heated under reflux for 16 h. After cooling, the organic phase is separated off, washed three times with 200 ml of water and subsequently evaporated to dryness. The residue is extracted with hot toluene, recrystallised from toluene and finally sublimed in a high vacuum, the purity is 99.9%. Yield: 28 g (67 mmol, 80%) of theory.

Compounds 8a-8d are obtained analogously:
| Ex. | Starting material 1 | Starting material 2 |
|---|---|---|
| 8a | (structure) | (structure) [6267-02-3] |
| 8b | (structure) | (structure) [888008-94-4] |
| 8c | (structure) | (structure) [4018-68-2] |
| 8d | (structure) | (structure) [1236106-99-2] |
| Ex. | Product | Yield |
|---|---|---|
| 8a | 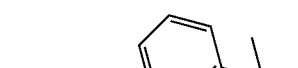 | 65% |

-continued

| | | |
|---|---|---|
| 8b | 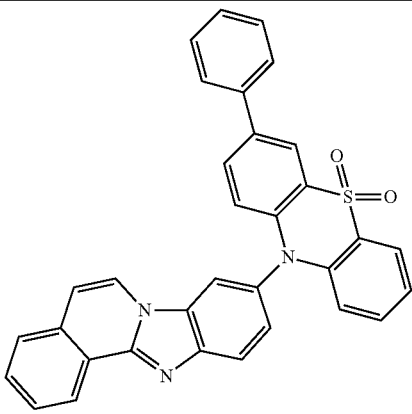 | 71% |
| 8c | 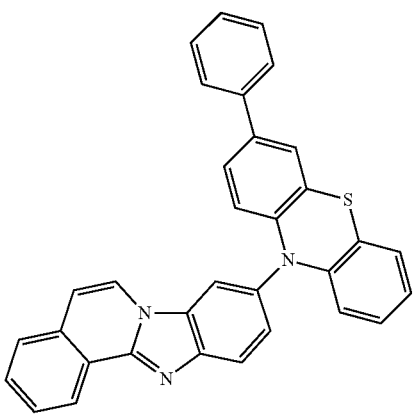 [SMILES: c1ccc(-c2ccc3c(c2)Sc2ccccc2N3c2ccc3nc4c5ccccc5ccn4c3c2)cc1] | 73% |
| 8d | 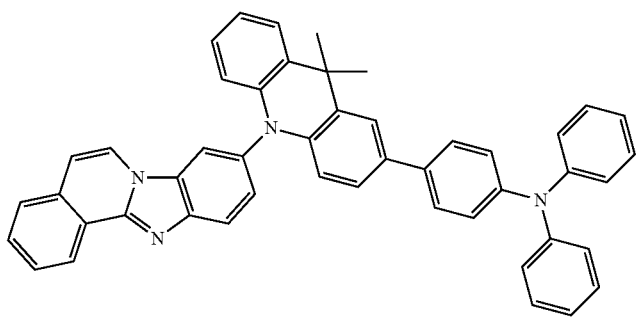 [SMILES: CC1(C)c2ccccc2N(c2ccc3nc4c5ccccc5ccn4c3c2)c2ccc(-c3ccc(N(c4ccccc4)c4ccccc4)cc3)cc21] | 78% |

Example 9

Production of OLEDs

OLEDs according to the invention and OLEDs in accordance with the prior art are produced by a general process in accordance with WO 2004/058911, which is adapted to the circumstances described here (layer-thickness variation, materials).

The data for various OLEDs are presented in Examples E1 to E13 below (see Tables 1 and 2). Glass plates coated with structured ITO (indium tin oxide) in a thickness of 50 or 150 nm are coated with 20 nm of PEDOT (poly(3,4-ethylene-dioxy-2,5-thiophene), applied by spin coating from water; purchased from H. C. Starck, Goslar, Germany) for improved processing. These coated glass plates form the substrates to which the OLEDs are applied. The OLEDs basically have the following layer structure: substrate/optional hole-injection layer (HIL)/hole-transport layer (HTL)/optional interlayer (IL)/electron-blocking layer (EBL)/emission layer (EVIL)/optional hole-blocking layer (HBL)/electron-transport layer (ETL)/optional electron-injection layer (EIL) and finally a cathode. The cathode is formed by an aluminium layer with a thickness of 100 nm. The precise structure of the OLEDs is shown in Table 1. The green-emitting OLEDs are produced on ITO with a thickness of 50 nm, the red-emitting OLEDs are produced on ITO with a thickness of 150 nm. The materials used for the production of the OLEDs are shown in Table 3. The compounds which are not shown in Table 3, but are merely denoted by a number in bold print relate to the compounds of the present invention, the synthesis of which is described in Examples 1 to 8; the number thus designates the number of the corresponding synthesis example.

All materials are applied by thermal vapour deposition in a vacuum chamber. The emission layer here always consists of at least one matrix material (host material) and an emitting dopant (emitter), which is admixed with the matrix material or matrix materials in a certain proportion by volume by co-evaporation. An expression such as ST1:3i:TEG1 (30%:60%:10%) here means that material ST1 is present in the layer in a proportion by volume of 30%, 3i is present in the layer in a proportion of 60% and TEG1 is present in the layer in a proportion of 10%. The electron-transport layer may analogously also consist of a mixture of two materials.

The OLEDs are characterised by standard methods. For this purpose, the electroluminescence spectra, the current efficiency (measured in cd/A), the power efficiency (measured in lm/W) and the external quantum efficiency (EQE, measured in percent) as a function of the luminous density, calculated from current/voltage/luminous density characteristic lines (IUL characteristic lines) assuming Lambert emission characteristics, are determined. The electroluminescence spectra are determined at a luminous density of 1000 cd/m$^2$, and the CIE 1931x and y colour coordinates are calculated therefrom. The expression U1000 in Table 2 denotes the voltage which is required for a luminous density of 1000 cd/m$^2$. CE1000 and PE1000 denote the current and power efficiency respectively which are achieved at 1000 cd/m$^2$. Finally, EQE1000 denotes the external quantum efficiency at an operating luminous density of 1000 cd/m$^2$.

The data for the various OLEDs are summarised in Table 2. Some of these examples are explained in greater detail below in order to illustrate the advantages of the compounds according to the invention. However, it should be pointed out that this only represents a selection of the data shown. As can be seen from the table, good to very good values for voltage and efficiency are also achieved on use of the compounds according to the invention which are not described in greater detail.

Use of Compounds According to the Invention as Matrix Materials in Phosphorescent OLEDs The materials according to the invention can either be employed as single matrix (Examples E7 to E10) or in combination with a further matrix material ("mixed matrix", Examples E1 to E4, E11 to E13). On use of red- and also green-phosphorescent emitters, good to very good performance data are obtained. For example, a very good external quantum efficiency of almost 16% (Example E7) is obtained with compound 7 (i.e. the compound according to Example 7). Mixing of ST1 with compound 8a according to the invention gives a very low voltage of 3.5 V (Example E4).

Use of Compounds According to the Invention as Electron-Transport Materials

On use of compound 7b according to the invention in the electron-transport layer, a voltage of only 3.6 V is required for 1000 cd/m$^2$. At this luminous density, an external quantum efficiency of somewhat greater than 16% is obtained (Example E6). If the OLED from Example E6 is operated with a constant current density of 20 mA/cm$^2$, the initial luminous density of 9700 cd/m$^2$ drops to 80% over the course of about 140 h. Besides good voltage and efficiency, good lifetimes are thus also obtained with compounds according to the invention.

TABLE 1

Structure of the OLEDs

| Ex. | HIL Thickness | HTL Thickness | IL Thickness | EBL Thickness | EML Thickness | HBL Thickness | ETL Thickness | EIL Thickness |
|---|---|---|---|---|---|---|---|---|
| E1 | — | SpA1 70 nm | HATCN 5 nm | SpA2 90 nm | ST1:3c:TEG1 (30%:60%:10%) 30 nm | IC1 10 nm | ST1:LiQ (50%:50%) 30 nm | — |
| E2 | — | SpA1 70 nm | HATCN 5 nm | SpA2 90 nm | ST1:3i:TEG1 (30%:60%:10%) 30 nm | IC1 10 nm | ST1:LiQ (50%:50%) 30 nm | — |
| E3 | — | SpA1 20 nm | — | NPB 20 nm | ST1:3j:TER1 (35%:50%:15%) 30 nm | ST1 10 nm | Alq$_3$ 20 nm | LiF 1 nm |
| E4 | — | SpA1 70 nm | HATCN 5 nm | SpA2 90 nm | IC1:8a:TEG1 (65%:25%:10%) 30 nm | IC1 10 nm | ST1:LiQ (50%:50%) 30 nm | — |
| E5 | SpA1 140 nm | HATCN 5 nm | NPB 10 nm | 3f 10 nm | IC1:TEG1 (90%:10%) 30 nm | — | ST2:LiQ (50%:50%) 40 nm | — |
| E6 | — | SpA1 70 nm | HATCN 5 nm | SpA2 90 nm | IC1:TEG1 (90%:10%) 30 nm | — | 7b 40 nm | LiQ 3 nm |
| E7 | — | SpA1 70 nm | HATCN 5 nm | SpA2 90 nm | 7:TEG1 (90%:10%) 30 nm | — | ST1:LiQ (50%:50%) 40 nm | — |
| E8 | — | SpA1 70 nm | HATCN 5 nm | SpA2 90 nm | 7a:TEG1 (90%:10%) 30 nm | — | ST1:LiQ (50%:50%) 40 nm | — |
| E9 | — | SpA1 20 nm | — | NPB 20 nm | 7e:TER1 (85%:15%) 30 nm | IC1 10 nm | Alq$_3$ 20 nm | LiF 1 nm |
| E10 | — | SpA1 20 nm | — | NPB 20 nm | 7h:TER1 (85%:15%) 30 nm | IC2 10 nm | Alq$_3$ 20 nm | LiF 1 nm |
| E11 | — | SpA1 70 nm | HATCN 5 nm | SpA2 90 nm | ST1:7c:TEG1 (30%:60%:10%) 30 nm | IC1 10 nm | ST1:LiQ (50%:50%) 30 nm | — |
| E12 | — | SpA1 70 nm | HATCN 5 nm | SpA2 90 nm | 7:IC3:TEG1 (30%:60%:10%) 30 nm | IC1 10 nm | ST1:LiQ (50%:50%) 30 nm | — |

TABLE 1-continued

Structure of the OLEDs

| Ex. | HIL Thickness | HTL Thickness | IL Thickness | EBL Thickness | EML Thickness | HBL Thickness | ETL Thickness | EIL Thickness |
|---|---|---|---|---|---|---|---|---|
| E13 | — | 8d 70 nm | HATCN 5 nm | SpA2 90 nm | IC1:TEG1 (90%:10%) 30 nm | — | ST2:LiQ (50%:50%) 40 nm | — |

TABLE 2

Data for the OLEDs

| Ex. | U1000 (V) | CE1000 (cd/A) | PE1000 (lm/W) | EQE 1000 | CIE x/y at 1000 cd/m$^2$ |
|---|---|---|---|---|---|
| E1 | 3.6 | 53 | 46 | 14.8% | 0.34/0.62 |
| E2 | 3.9 | 55 | 45 | 15.4% | 0.34/0.62 |
| E3 | 5.1 | 7.7 | 4.7 | 10.8% | 0.69/0.31 |
| E4 | 3.5 | 54 | 48 | 15.0% | 0.33/0.62 |
| E5 | 3.4 | 59 | 55 | 16.5% | 0.34/0.62 |
| E6 | 3.6 | 57 | 50 | 16.1% | 0.34/0.62 |
| E7 | 3.8 | 57 | 48 | 15.9% | 0.34/0.62 |
| E8 | 3.7 | 54 | 46 | 15.1% | 0.34/0.62 |
| E9 | 4.4 | 7.1 | 5.1 | 11.9% | 0.69/0.31 |
| E10 | 5.4 | 7.9 | 4.6 | 13.3% | 0.69/0.31 |
| E11 | 3.6 | 49 | 43 | 13.8% | 0.34/0.62 |
| E12 | 3.7 | 53 | 45 | 14.7% | 0.33/0.62 |
| E13 | 3.5 | 60 | 53 | 16.8% | 0.33/0.62 |

TABLE 3

Structural formulae of the materials for the OLEDs

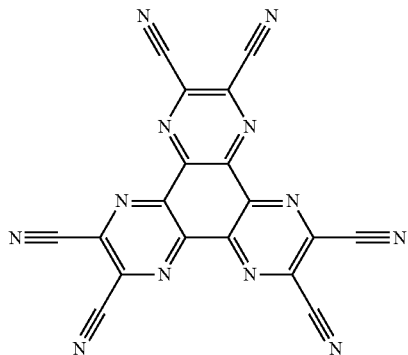 [SMILES: N#Cc1nc2c3nc(C#N)c(C#N)nc3c3nc(C#N)c(C#N)nc3c2nc1C#N]

HATCN

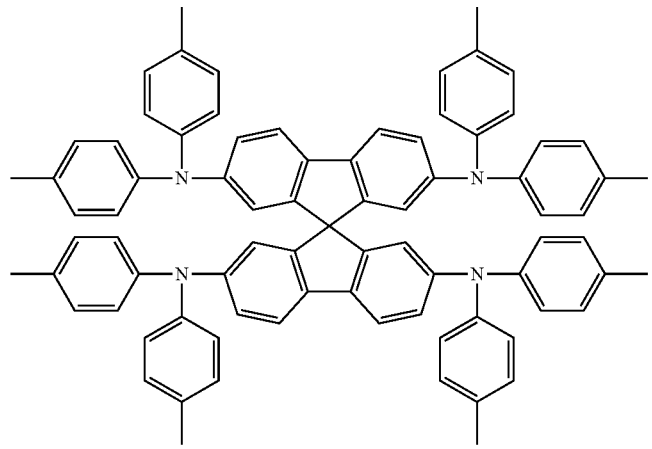

SpA1

TABLE 3-continued
Structural formulae of the materials for the OLEDs
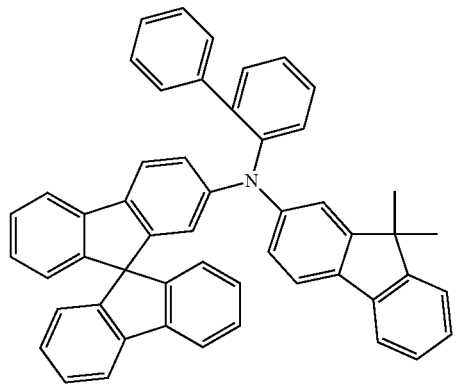 [SMILES: CC1(C)c2ccccc2-c2ccc(N(c3ccc4c(c3)C3(c5ccccc5-c5ccccc53)c3ccccc3-4)c3ccccc3-c3ccccc3)cc21]
SpA2
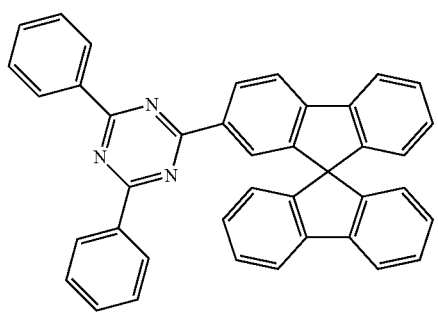 [SMILES: c1ccc(-c2nc(-c3ccccc3)nc(-c3ccc4c(c3)C3(c5ccccc5-c5ccccc53)c3ccccc3-4)n2)cc1]
ST1
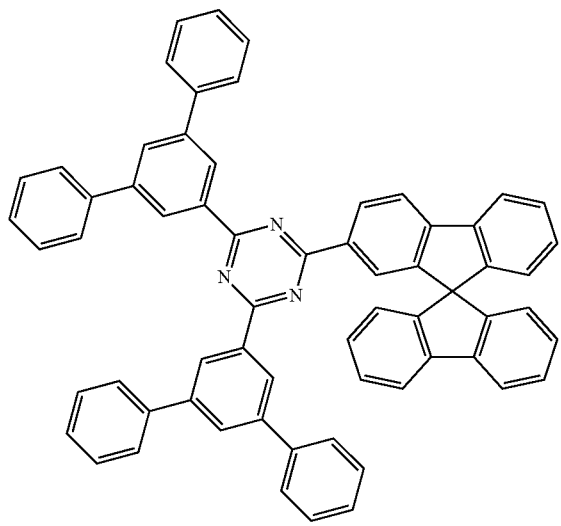 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]
ST2

TABLE 3-continued
Structural formulae of the materials for the OLEDs
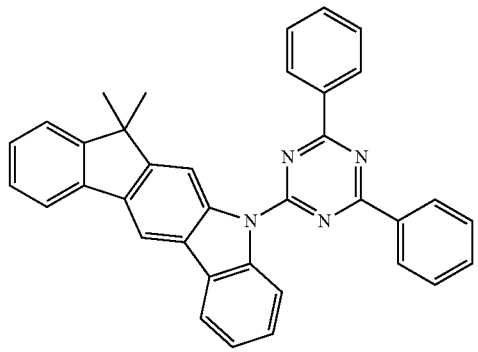
IC1
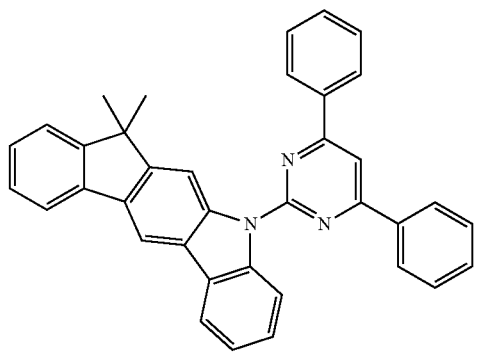 [SMILES: CC1(C)c2ccccc2-c2cc3c4ccccc4n(-c4nc(-c5ccccc5)cc(-c5ccccc5)n4)c3cc21]
IC2
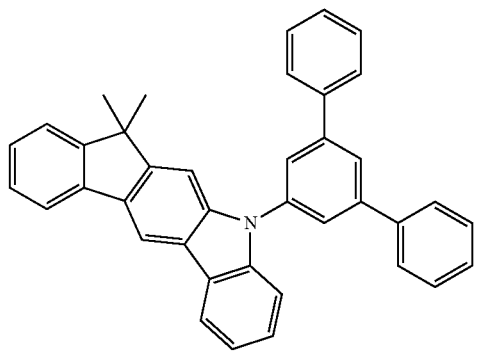
IC3
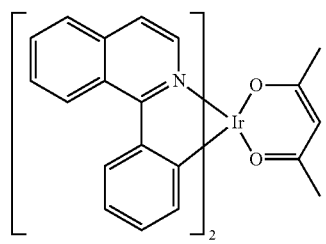
TER1

TABLE 3-continued

Structural formulae of the materials for the OLEDs

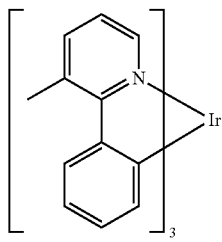

TEG1

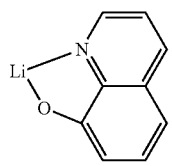

LIQ

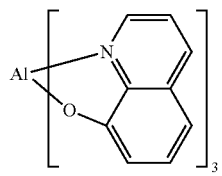

Alq₃

The invention claimed is:

1. An organic electroluminescent device comprising at least one compound of the formula (1) or formula (2),

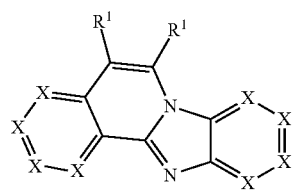

formula (1)

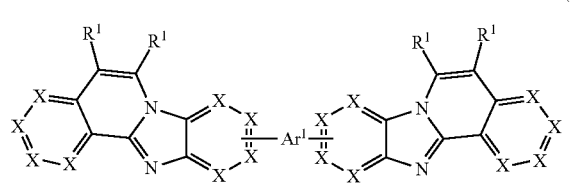

formula (2)

where the following applies to the symbols and indices used:

X is on each occurrence, identically or differently, CR or N, with the proviso that a maximum of two groups X which are bonded directly to one another stand for N;

R is selected on each occurrence, identically or differently, from the group consisting of H, D, F, Cl, Br, I, CN, NO$_2$, N(Ar)$_2$, N(R$^2$)$_2$, C(=O)Ar, C(=O)R$^2$, P(=O)(Ar)$_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which may be substituted by one or more radicals R$^2$, where one or more non-adjacent CH$_2$ groups may be replaced by R$^2$C=CR$^2$, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms may be replaced by D, F, Cl, Br, I, CN or NO$_2$, an aromatic or heteroaromatic ring system having 5 to 80 aromatic ring atoms, which may in each case be substituted by one or more radicals R$^2$, an aryloxy or heteroaryloxy group having 5 to 60 aromatic ring atoms, which may be substituted by one or more radicals R$^2$, or an aralkyl or heteroaralkyl group having 5 to 60 aromatic ring atoms, which may be substituted by one or more radicals R$^2$, wherein at least one group R in the compound of formula (1) is not equal to H or D;

R$^1$ is selected on each occurrence, identically or differently, from the group consisting of H, D, F, Cl, Br, I, CN, NO$_2$, N(Ar)$_2$, N(R$^2$)$_2$, C(=O)Ar, C(=O)R$^2$, P(=O)(Ar)$_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which may be substituted by one or more radicals R$^2$, where one or more non-adjacent CH$_2$ groups may be replaced by R$^2$C=CR$^2$, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms may be replaced by D, F, Cl, Br, I, CN or NO$_2$, an aromatic or heteroaromatic ring system having 5 to 80 aromatic ring atoms, which may in each case be substituted by one or more radicals R$^2$, an aryloxy or heteroaryloxy group having 5 to 60 aromatic ring atoms, which may be substituted by one or more radicals R², or an aralkyl or heteroaralkyl group having 5 to 60 aromatic ring atoms, which may be substituted by one or more radicals R²;

Ar¹ is, identically or differently on each occurrence, a divalent aryl or heteroaryl group having 5 to 18 C atoms, which may be substituted by one or more radicals R²;

R² is selected on each occurrence, identically or differently, from the group consisting of H, D, F, Cl, Br, I, CN, NO₂, N(Ar)₂, N(R³)₂, C(=O)Ar, C(=O)R³, P(=O)(Ar)₂, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which may be substituted by one or more radicals R³, where one or more non-adjacent CH₂ groups may be replaced by R³C=CR³, C≡C, Si(R³)₂, Ge(R³)₂, Sn(R³)₂, C=O, C=S, C=Se, C=NR³, P(=O)(R³), SO, SO₂, NR³, O, S or CONR³ and where one or more H atoms may be replaced by D, F, Cl, Br, I, CN or NO₂, an aromatic or heteroaromatic ring system having 5 to 60 aromatic ring atoms, which may in each case be substituted by one or more radicals R³, an aryloxy or heteroaryloxy group having 5 to 60 aromatic ring atoms, which may be substituted by one or more radicals R³, or an aralkyl or heteroaralkyl group having 5 to 60 aromatic ring atoms;

Ar is on each occurrence, identically or differently, an aromatic or heteroaromatic ring system having 5-30 aromatic ring atoms, which may be substituted by one or more non-aromatic radicals R³; two radicals Ar here which are bonded to the same N atom or P atom may also be bridged to one another by a single bond or a bridge selected from N(R³), C(R³)₂, O or S;

R³ is selected from the group consisting of H, D, F, CN, an aliphatic hydrocarbon radical having 1 to 20 C atoms, an aromatic or heteroaromatic ring system having 5 to 30 aromatic ring atoms, in which one or more H atoms may be replaced by D, F, Cl, Br, I or CN;

q is on each occurrence, identically or differently, 0, 1, 2 or 3;

and wherein the compound of the formula (1) or formula (2) is employed as matrix material for a fluorescent or phosphorescent compound in an emitting layer and/or in that the compound of the formula (1) or formula (2) is employed as electron-transport material in an electron-transport or electron-injection layer and/or in that the compound of the formula (1) or formula (2) is employed in a hole-blocking layer and/or in that the compound of the formula (1) or formula (2) is employed in a hole-transport layer or in a hole-injection layer or in an electron-blocking layer or exciton-blocking layer.

2. The organic electroluminescent device according to claim 1, wherein a maximum of one group X in each ring stands for N and the other groups X stand, identically or differently on each occurrence, for CR.

3. The organic electroluminescent device according to claim 1, wherein the compound of the formula (1) is selected from the structures of the formulae (3) to (11) and in that the compound of the formula (2) is selected from the structures of the formula (12),

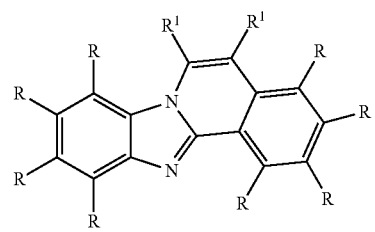
formula (3)

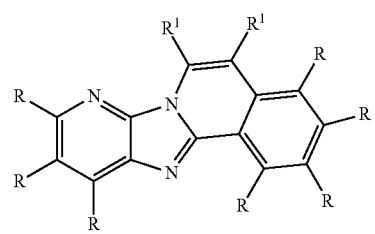
formula (4)

formula (5)

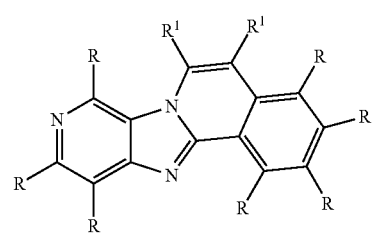
formula (6)

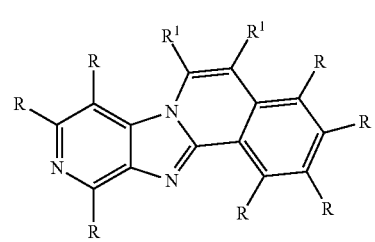
formula (7)

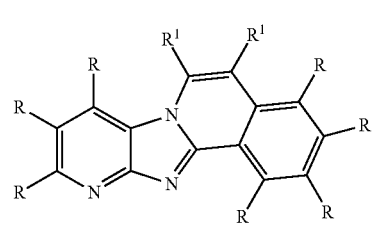
formula (8)

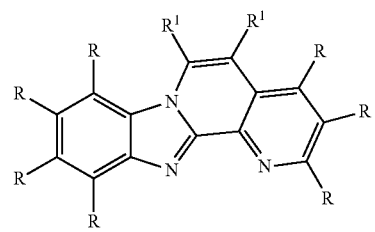
formula (9)

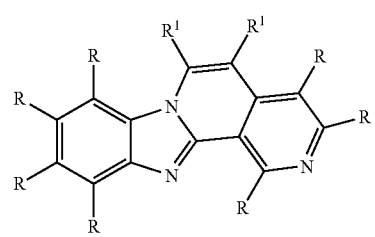

formula (10)

formula (11)

formula (12)

where the symbols and indices used have the meanings given in claim 1.

4. The organic electroluminescent device according to claim 1, wherein at least one group $R^1$ in the compound of the formula (1) or (2) is not equal to H or D.

5. The organic electroluminescent device according to claim 1, wherein the compound of the formula (1) is selected from the compounds of the formulae (3a) to (3i), formula (3c)

formula (3d)

formula (3e)

formula (3f)

formula (3g)

formula (3h)

formula (3i)

where the symbols used have the meanings given in claim 1 and R and $R^1$ are not equal to H or D.

6. The organic electroluminescent device according to claim 1, wherein R or $R^1$ is selected on each occurrence, identically or differently, from the group consisting of H, D, F, CN, $N(Ar)_2$, $C(=O)Ar$, $P(=O)(Ar)_2$, a straight-chain alkyl group having 1 to 10 C atoms or a branched or cyclic alkyl group having 3 to 10 C atoms or an alkenyl group having 2 to 10 C atoms, each of which may be substituted by one or more radicals $R^2$, where one or more non-adjacent $CH_2$ groups may be replaced by O or S and where one or more H atoms may be replaced by D or F, an aromatic or heteroaromatic ring system having 6 to 30 aromatic ring atoms, which may in each case be substituted by one or more radicals $R^2$.

7. The organic electroluminescent device according to claim 1, wherein at least one substituent R and/or $R^1$ is selected from structures of the formulae (13) to (17), formula (13)

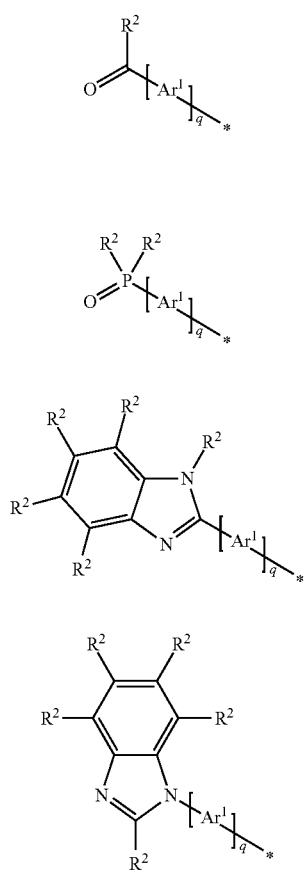

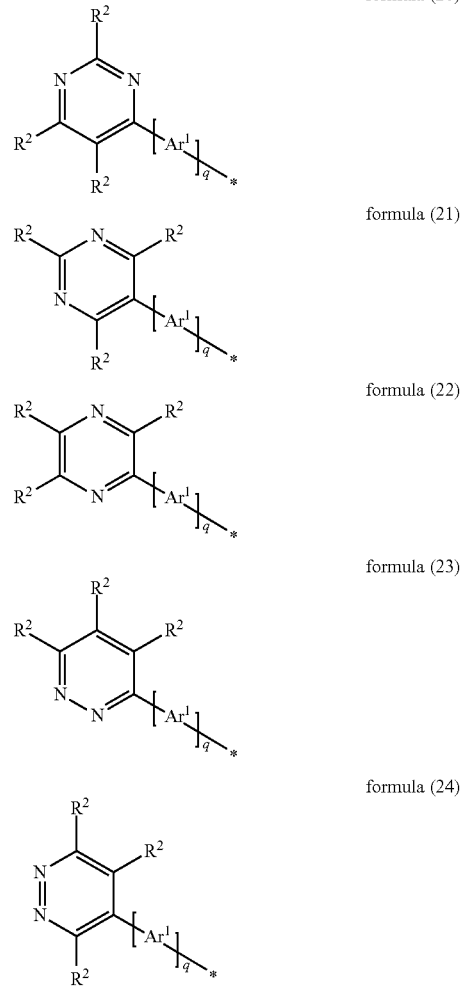

where the symbols and indices have the meanings given in claim 1, * indicates the position of the bond to the basic structure of the formula (1) or formula (2) and furthermore:

Z is on each occurrence, identically or differently, $CR^2$ or N, with the proviso that one group Z, two groups Z or three groups Z stand for N.

8. The organic electroluminescent device according to claim 7, wherein at least one substituent R or $R^1$ is selected from the groups of the formulae (18) to (24),

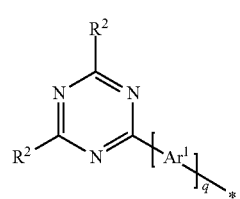

where the symbols and indices used have the meanings given in claim 1.

9. The organic electroluminescent device according to claim 1, wherein at least one substituent R or $R^1$ is selected from the group consisting of —$N(Ar)_2$, triarylamine derivatives, carbazole derivatives, indenocarbazole derivatives, indolocarbazole derivatives, azacarbazole derivatives, indole derivatives, furan derivatives, benzofuran derivatives, dibenzofuran derivatives, thiophene derivatives, benzothiophene derivatives or dibenzothiophene derivatives, each of which may be substituted by one or more radicals $R^2$.

10. The organic electroluminescent device according to claim 9, wherein at least one substituent R or $R^1$ is selected from the groups of the formulae (25) to (42),

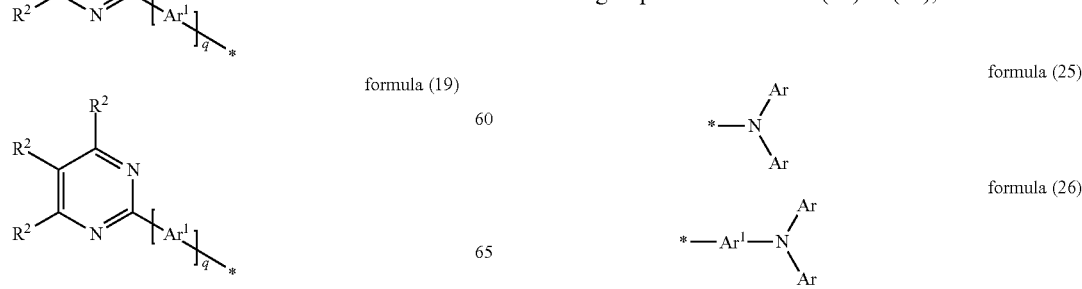

formula (27)
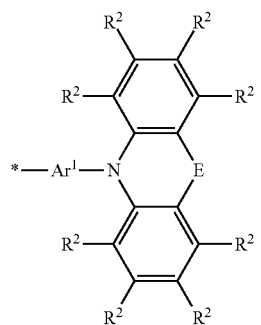
formula (28)
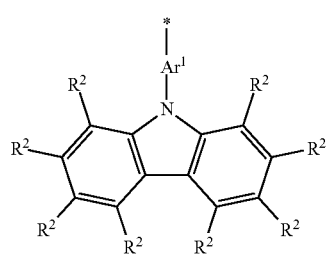
formula (29)
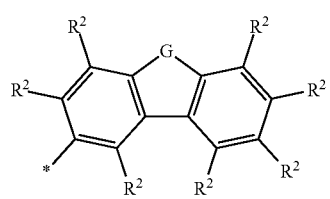
formula (30)
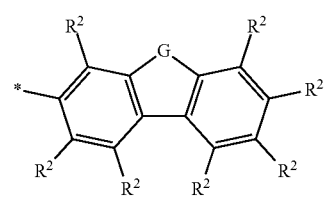
formula (31)
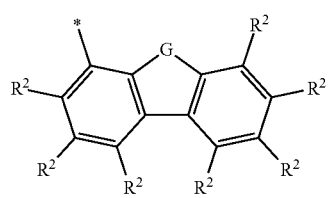
formula (32)
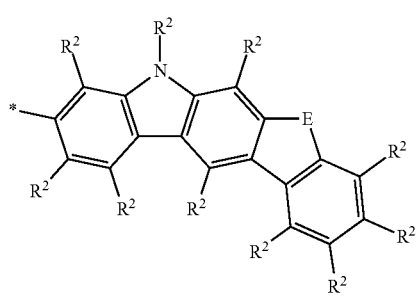
formula (33)
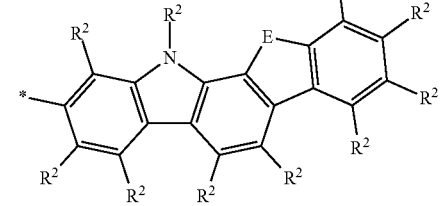
formula (34)
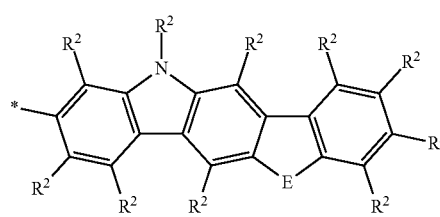
formula (35)
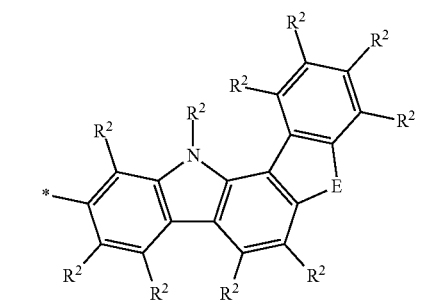
formula (36)
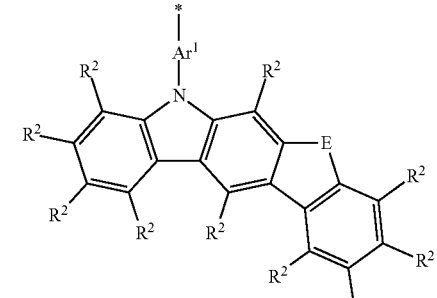
formula (37)
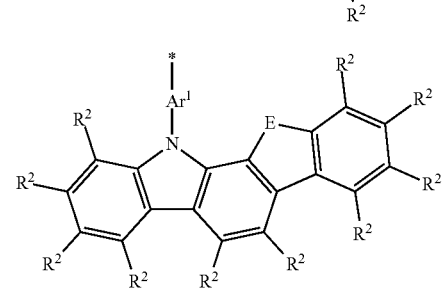

formula (38)

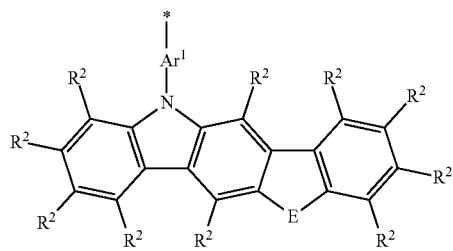

formula (39)

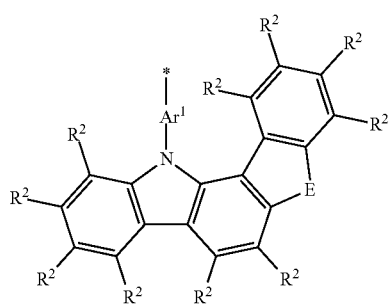

formula (40)

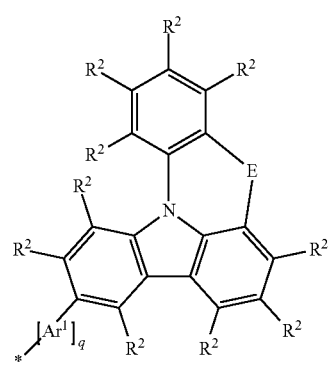

formula (41)

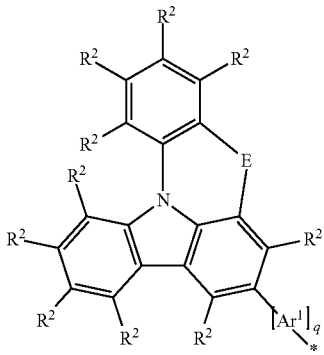

formula (42)

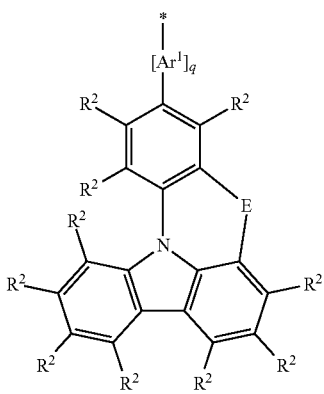

where the symbols used have the meanings given above and furthermore:

E is selected from the group consisting of $C(R^2)_2$, $NR^2$, O or S;

G is selected from the group consisting of $NR^2$, O or S.

11. A process for the production of an organic electroluminescent device according to claim 1, wherein at least one layer is applied by a sublimation process or in that at least one layer is applied by the OVPD process or in that at least one layer is applied from solution or by a printing process.

* * * * *